(12) United States Patent
Wang

(10) Patent No.: US 11,387,290 B2
(45) Date of Patent: Jul. 12, 2022

(54) PHOTODETECTOR, DISPLAY SUBSTRATE INCLUDING PHOTODETECTOR, METHOD OF FABRICATING PHOTODETECTOR, AND DISPLAY PANEL

(71) Applicant: BOE TECHNOLOGY GROUP CO., LTD., Beijing (CN)

(72) Inventor: Guoqiang Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 315 days.

(21) Appl. No.: 16/487,577

(22) PCT Filed: Apr. 2, 2019

(86) PCT No.: PCT/CN2019/081004
§ 371 (c)(1),
(2) Date: Aug. 21, 2019

(87) PCT Pub. No.: WO2020/062825
PCT Pub. Date: Apr. 2, 2020

(65) Prior Publication Data
US 2021/0335917 A1    Oct. 28, 2021

(30) Foreign Application Priority Data

Sep. 28, 2018  (CN) .......................... 201811142793.5

(51) Int. Cl.
*H01L 27/32* (2006.01)
*H01L 51/52* (2006.01)
*H01L 51/56* (2006.01)

(52) U.S. Cl.
CPC ...... *H01L 27/3227* (2013.01); *H01L 27/3269* (2013.01); *H01L 51/5218* (2013.01); *H01L 51/5234* (2013.01); *H01L 51/56* (2013.01)

(58) Field of Classification Search
CPC ............. H01L 27/3227; H01L 27/3269; H01L 51/5218; H01L 51/5234; H01L 51/56
See application file for complete search history.

(56) References Cited

U.S. PATENT DOCUMENTS

| | | | |
|---|---|---|---|
| 8,674,964 B2 * | 3/2014 | Huang | G09G 3/3233 345/175 |
| 2010/0117517 A1 * | 5/2010 | Cok | H01L 51/5265 313/503 |

(Continued)

FOREIGN PATENT DOCUMENTS

| CN | 101964353 A | 2/2011 |
|---|---|---|
| CN | 106449684 A | 2/2017 |

(Continued)

OTHER PUBLICATIONS

Office Action dated Dec. 20, 2019, issued in counterpart CN Application No. 201811142793.5, with English translation. (19 pages).

(Continued)

*Primary Examiner* — Jarrett J Stark
(74) *Attorney, Agent, or Firm* — WHDA, LLP

(57) ABSTRACT

A photodetector (300) includes a first electrode (313) and a second electrode (314) on a base substrate (100); a light-sensitive layer (311) between the first electrode (313) and the second electrode (314); and a light-trapping layer (312) between the light-sensitive layer (311) and the base substrate (100), wherein a surface of the light-trapping layer (312) opposite from the base substrate (100) comprises a plurality of first recessed portions.

10 Claims, 27 Drawing Sheets

(56) References Cited

U.S. PATENT DOCUMENTS

| | | | |
|---|---|---|---|
| 2012/0146172 A1 | 6/2012 | Carey et al. | |
| 2016/0260752 A1* | 9/2016 | Shieh | H01L 51/003 |
| 2017/0078513 A1* | 3/2017 | Chang | G06F 3/0304 |
| 2017/0337413 A1* | 11/2017 | Bhat | G06K 9/00087 |
| 2019/0067384 A1 | 2/2019 | Zou | |
| 2019/0303639 A1* | 10/2019 | He | G06K 9/0012 |
| 2021/0319197 A1* | 10/2021 | Chang | G06F 3/044 |

FOREIGN PATENT DOCUMENTS

| | | |
|---|---|---|
| CN | 106654067 A | 5/2017 |
| CN | 107093619 A | 8/2017 |
| CN | 107464529 A | 12/2017 |
| CN | 107546337 A | 1/2018 |
| CN | 109285870 A | 1/2019 |
| KR | 20180070785 A | 6/2018 |

OTHER PUBLICATIONS

Translation of International Search Report dated Jul. 2, 2019, issued in counterpart Application No. PCT/CN2019/081004. (5 pages).

* cited by examiner

PHOTODETECTOR, DISPLAY SUBSTRATE INCLUDING PHOTODETECTOR, METHOD OF FABRICATING PHOTODETECTOR, AND DISPLAY PANEL

CROSS-REFERENCE TO RELATED APPLICATIONS

This application claims benefit of the filing date of Chinese Patent Application No. 201811142793.5 filed on Sep. 28, 2018, the disclosure of which is hereby incorporated in its entirety by reference.

TECHNICAL FIELD

The present disclosure generally relates to a photodetector, a display substrate including a photodetector, a method of fabricating a photodetector, and a display panel.

BACKGROUND

Currently, the display technologies mainly include two main categories: organic light emitting diode (OLED) technology and liquid crystal display (LCD) technology. OLED is an organic thin film electroluminescent display device, and has numerous advantages that contribute to their popularity in the field of display technology. For example, OLED devices are self-illuminating, and are capable of high luminance, high contrast, simple construction, low power consumption and high energy efficiency, wide viewing angles, flexible display, and three-dimensional (3D) display. These advantages combine to make OLED a focus in the developments of display technologies.

BRIEF SUMMARY

An embodiment of the present disclosure is a photodetector. The photodetector may comprise a first electrode and a second electrode on a base substrate; a light-sensitive layer between the first electrode and the second electrode; and a light-trapping layer between the light-sensitive layer and the base substrate, wherein a surface of the light-trapping layer opposite from the base substrate comprises a plurality of first recessed portions.

In at least some embodiments, an average depth of the plurality of first recessed portions is approximately between 2 to 10 nm.

In at least some embodiments, an average width of the plurality of first recessed portions is 100 nm or less, the average width being measured in a direction parallel to the base substrate.

In at least some embodiments, the light-trapping layer comprises polycrystalline silicon.

In at least some embodiments, the light-trapping layer and the first electrode are an integral structure.

In at least some embodiments, the light-trapping layer is between the first electrode and the light-sensitive layer, and the light-trapping layer is electrically conductive.

In at least some embodiments, the light-trapping layer is between the first electrode and the base substrate. In at least some embodiments, a surface of the first electrode facing the light-trapping layer comprises a plurality of second recessed portions that are complementary to the plurality of first recessed portions.

In at least some embodiments, the light-sensitive layer comprises a PIN junction.

In at least some embodiments, the first electrode, the light-sensitive layer, and the second electrode are arranged sequentially on the base substrate. In at least some embodiments, a surface of the light-sensitive layer facing the first electrode forms the light-trapping layer.

Another embodiment of the present disclosure is a display substrate. The display substrate may comprise a photodetector as described above, and a pixel unit comprising a light-emitting device configured to emit a light. In at least some embodiments, the photodetector is configured to receive the light emitted by the light-emitting device. In at least some embodiments, an orthographic projection of the light-emitting device on the base substrate does not overlap with an orthographic projection of the photodetector on the base substrate.

In at least some embodiments, the pixel unit may further comprise a first switch between the base substrate and the light-emitting device. In at least some embodiments, the photodetector may further comprise a second switch between the base substrate and the first electrode. In at least some embodiments, the first electrode may be coupled to the second switch.

In at least some embodiments, the light-emitting device may comprise a third electrode, a light-emitting layer, and a fourth electrode arranged in a stack, the fourth electrode being farther from the base substrate than the third electrode and the light-emitting layer. In at least some embodiments, the third electrode may be coupled to the first switch.

In at least some embodiments, the third electrode may be a reflective electrode, and the fourth electrode is a transparent electrode. In at least some embodiments, an orthographic projection of the light-sensitive layer on the base substrate may be entirely outside an orthographic projection of the third electrode on the base substrate.

In at least some embodiments, the third electrode may comprise at least one sub-electrode layer composed of a transparent conductive material, and a reflective layer composed of a metallic material selected from the group consisting of silver, aluminum, copper, and an alloy thereof.

In at least some embodiments, the third electrode may be a transparent electrode, and the fourth electrode is a reflective electrode. In at least some embodiments, an orthographic projection of the light-sensitive layer on the base substrate may at least partially overlap with an orthographic projection of the third electrode on the base substrate.

In at least some embodiments, the fourth electrode may be composed of a metallic material selected from the group consisting of lithium, magnesium, calcium, barium, aluminum, indium, and an alloy thereof.

Another embodiment of the present disclosure is a display panel. The display panel may comprise a display substrate as described above.

Another embodiment of the present disclosure is a method of fabricating a photodetector. The method may comprise: forming a first electrode, a second electrode on a base substrate, and a light-sensitive layer between the first electrode and the second electrode; and forming a light-trapping layer between the light-sensitive layer and the base substrate. In at least some embodiments, a surface of the light-trapping layer opposite from the base substrate may comprise a plurality of first recessed portions and a plurality of first raised portions.

In at least some embodiments, the forming a light-trapping layer between the light-sensitive layer and the base substrate may comprise: forming an amorphous material layer; and performing localized laser-annealing on the amorphous material layer through a micro lens array to obtain the light-trapping layer.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the present disclosure are apparent from the following detailed description taken in conjunction with the accompanying drawings in which:

Figure 1A:
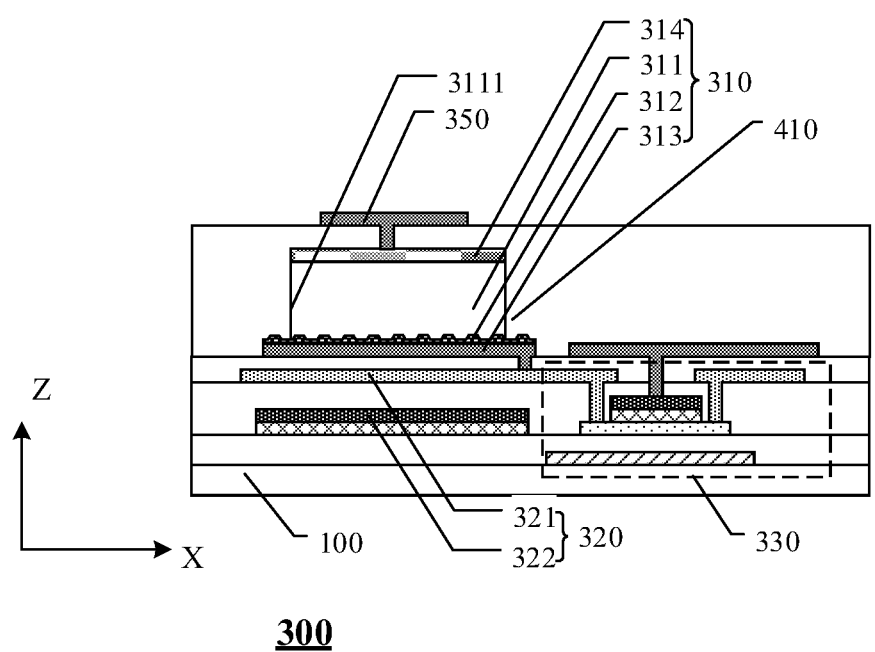
FIG. 1A shows a schematic cross-sectional view of a photodetector according to an embodiment of the present disclosure.

The various features of the drawings are not to scale as the illustrations are for clarity in facilitating one skilled in the art in understanding the invention in conjunction with the detailed description.

DETAILED DESCRIPTION

Next, the embodiments of the present disclosure will be described clearly and concretely in conjunction with the accompanying drawings, which are described briefly above. The subject matter of the present disclosure is described with specificity to meet statutory requirements. However, the description itself is not intended to limit the scope of this disclosure. Rather, the inventors contemplate that the claimed subject matter might also be embodied in other ways, to include different steps or elements similar to the ones described in this document, in conjunction with other present or future technologies.

While the present technology has been described in connection with the embodiments of the various figures, it is to be understood that other similar embodiments may be used or modifications and additions may be made to the described embodiments for performing the same function of the present technology without deviating therefrom. Therefore, the present technology should not be limited to any single embodiment, but rather should be construed in breadth and scope in accordance with the appended claims. In addition, all other embodiments obtained by one of ordinary skill in the art based on embodiments described in this document are considered to be within the scope of this disclosure.

A numerical range modified by "approximately" herein means that the upper and lower limits of the numerical range can vary by 10% thereof. A number modified by "approximately" herein means that the number can vary by 10% thereof.

Currently, the display technologies mainly include two main categories: organic light emitting diode (OLED) technology and liquid crystal display (LCD) technology. OLED is an organic thin film electroluminescent display device, and has numerous advantages that contribute to their popularity in the field of display technology. For example, OLED devices are self-illuminating, and are capable of high luminance, high contrast, simple construction, low power consumption and high energy efficiency, wide viewing angles, flexible display, and three-dimensional (3D) display. These advantages combine to make OLED a focus in the developments of display technologies.

Existing technologies for manufacturing OLED display devices have limitations. These limitations have been known to result in OLED display devices that, during illumination, may experience an errant differential between the driving voltage and the desired voltage. This in turn can prevent the OLED display device from attaining the desired brightness (grayscale), and reduce the display quality of the OLED display device.

For example, a display substrate generally includes a plurality of pixel units. Each pixel unit may include a light-emitting device and a drive circuit that powers the light-emitting device to emit light. The drive circuit may in turn include a drive transistor (for example, a thin film transistor). Due to inconsistencies and limitations in existing manufacturing processes, there may be differences among the threshold voltages for the drive transistors in the drive circuits. Further, the threshold voltage for a drive transistor may fluctuate in response to environmental variations, for example, temperature changes. Non-uniformity in the threshold voltages of the drive transistors may prevent the pixel units from producing the desired or expected brightness (grayscale), and as a result, the display quality of the OLED display device containing the pixel units suffers (for instance, the display may be uneven).

To address the above problems, it has been proposed that a compensation circuit be integrated into the drive circuit. The compensation circuit is configured to compensate for the threshold voltage of a pixel unit. However, a compensation circuit cannot compensate for display defects that originate from different causes. For example, inconsistencies in existing manufacturing processes may produce differences in the optical performances of the light-emitting devices in the pixel units of an OLED display device. These differences can also contribute to a poor display quality. Further, with time, the intensity of light emitted by the light-emitting devices drops, which may serve to amplify the differences in the light-emitting devices' optical performances. A compensation circuit in the drive circuit cannot monitor in real-time the optical performances of the light-emitting devices. A compensation circuit also cannot use the drive circuit to adjust the drive voltages of the light-emitting devices. Consequently, even with the integration of a compensation circuit in the drive circuit, defects in the display of the OLED display device may linger.

The present disclosure provides a display substrate, a method of fabricating a display substrate, and a display panel containing the display substrate. In the display substrate of the present disclosure, a light-trapping structure is provided that can lengthen the optical path of a light emitted from the light-emitting device in the light-sensitive layer. This can in turn increase the absorption of the emitted light by the light-sensitive layer, and increase the sensitivity and accuracy of the photodetector to improve the display functions of the display substrate.

More particularly, a display substrate according to the present disclosure may include a base substrate, and a pixel unit and a photodetector on the base substrate. The pixel unit may include a light-emitting device. The photodetector may include a photodetecting device that includes a light-sensitive layer and a light-trapping layer. The light-trapping layer is between the light-sensitive layer and the base substrate. The photodetecting device is configured to receive light emitted by the light-emitting device, evaluate the light intensity (or brightness, grayscale) of the pixel unit, and convert a light signal containing information relating to the light intensity (or brightness, grayscale) of the pixel unit into an electrical signal, and transmit the first electrical signal to a control circuit. Based on the first electrical signal, the control circuit directs the drive circuit for driving the light-emitting device to provide a compensation for the drive voltage for the light-emitting device, so that the intensity of light emitted by the light-emitting device is at the desired level, and the grayscale of the pixel unit matches the desired grayscale.

In addition, in a display substrate according to the present disclosure, the photodetector may include a light-trapping layer. The light-trapping layer is configured to lengthen the optical path of the light emitted by the light-emitting device in the light-sensitive layer, for example, by scattering, refracting, and/or reflecting the emitted light. Lengthening the optical path of the emitted light in the light-sensitive layer can increase the absorption of the emitted light by the light-sensitive layer, which can in turn increase the sensitivity and accuracy of the photodetector. This can further improve the display functions of the display substrate.

The present disclosure thus makes it possible to monitor in real-time the light intensity of a pixel unit, and adjust the light intensity of the pixel unit accordingly to the desired level. In turn, the display quality of the OLED display device can be improved, for example, in terms of grayscale, brightness, and evenness.

Figure 1B:
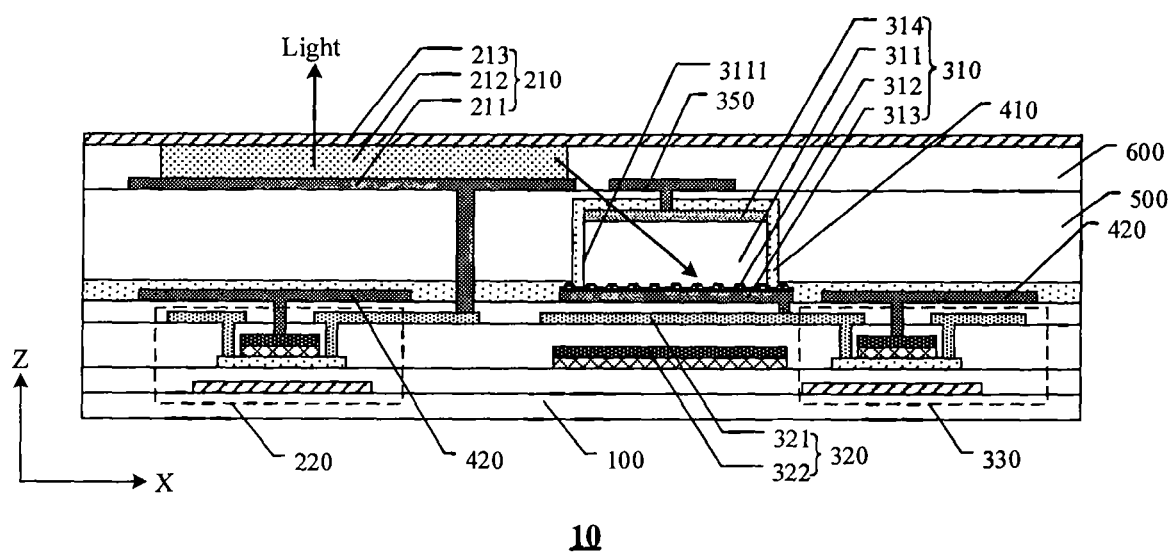
FIG. 1B shows a schematic cross-sectional view of a display substrate according to an embodiment of the present disclosure, which display substrate includes the photodetector illustrated in FIG. 1A.

FIG. 1A shows a schematic diagram of a cross-section of a photodetector according to an embodiment of the present disclosure. FIG. 1B shows a schematic diagram of a cross-section of a display substrate according to an embodiment of the present disclosure. which display substrate includes the photodetector illustrated in FIG. 1A. More specifically, FIG. 1B shows a cross-section of a pixel region in a display substrate according to an embodiment of the present disclosure. A display substrate according to the present disclosure is divided into a plurality of pixel regions. Each pixel region comprises a pixel unit and a photodetector.

As shown in FIG. 1A, the photodetector 300 includes a photodetecting device 310. The photodetector 300 includes a first electrode 313 and a second electrode 314 on a base substrate 100. A light-sensitive layer 311 is between the first electrode 313 and the second electrode 314. A light-trapping layer 312 is between the light-sensitive layer 311 and the base substrate 100. In some embodiments, the light-trapping layer 312 may be between the first electrode 313 and the light-sensitive layer 311. In some embodiments, the light-trapping layer 312 may be between the first electrode 313 and the base substrate 100. The light-sensitive layer 311, the light-trapping layer, the first electrode 313, and the second electrode 314 form the photodetecting device 310 of the photodetector 300.

One surface of the light-trapping layer 312 is opposite from the base substrate 100, and faces the light-sensitive layer 311, for example, as shown in FIG. 1A. The surface of the light-trapping layer 312 opposite from the base substrate 100 is an uneven surface comprising a plurality of recessed portions and a plurality of raised portions. The recessed portions may be formed as dents, grooves, and the like. However, the structure and configuration of the light-trapping layer are not particularly limited. The light-trapping layer may be configured in any appropriate manner known to a person of ordinary skill in the art, so long as the light-trapping layer is capable of trapping light and lengthening the optical path of the emitted light in the light-sensitive layer.

In at least some embodiments, an average depth of the plurality of recessed portions is between 2 to 10 nm. The depth of a recessed portion is measured in a direction perpendicular to the base substrate 100. In at least some embodiments, the average depth of the recessed portions is between 3 to 5 nm. For example, the average depth of the recessed portions may be 3.5 nm, 4 nm, or 4.5 nm.

In at least some embodiments, an average width of the plurality of recessed portions is 100 nm or less. The width of a recessed portion is measured in a direction parallel to the base substrate 100. In at least some embodiments, the average width of the recessed portions is 20-60 nm. For example, the average width of the recessed portions may be 30 nm or less, 40 nm or less, 47 nm or less, 50 nm or less, or 55 nm or less.

The display substrate 10 according to the present disclosure includes a base substrate 100, and a pixel unit 200 and a photodetector 300 on the base substrate 100. The pixel unit 200 and the photodetector 300 are arranged adjacent to each other on the base substrate 100, for example, as shown in FIG. 1B. The pixel unit 200 includes a light-emitting device 210.

Light (for example, a portion of the light emitted by the light-emitting device 210) that enters the light-sensitive layer 311 is modulated by the light-trapping layer 312, for example, through scattering, refraction, reflection, and the like. As a result of this modulation, the optical path of the light in the light-sensitive layer 311 is effectively lengthened as compared to a photodetector without a light-trapping layer. Lengthening the optical path may increase the absorption of the light by the light-sensitive layer 311, and reduces the dependence of the sensitivity and accuracy of the photodetecting device 310 on the intensity of light received, and/or the material of the light-sensitive layer 311. For example, in a display substrate without the light-trapping layer 312 according to the present disclosure, light absorption by the photodetecting device 310 may be reduced as a result of reduced intensity of light emitted from the light-emitting device. As another example, light absorption by the photodetecting device 310 may be curtailed as a result of the inherent lower light-absorption rate of the materials forming the photodetecting device 310. Eliminating the dependence of the photodetecting device 310 on such parameters as light intensity and composition, the grayscale of the pixel unit 200 may be monitored in real-time, which can facilitate the display functions of the display substrate 10.

In FIGS. 1A and 1B, the x-axis and y-axis define a plane that is parallel to the surface of the base substrate 100, and the z-axis defines a plane that is perpendicular to the surface of the base substrate 100. In addition, "top" and "bottom" are defined in relation to the base substrate 100. The light-trapping layer 312 is on the base substrate 100, and the light-sensitive layer 311 is on the light-trapping layer 312. The surface of the light-sensitive layer 311 opposite from the base substrate 100 is the upper surface, and the surface of the light-sensitive layer 311 facing the base substrate 100 is the lower surface. The surfaces of the light-sensitive layer 311 connecting the upper surface and the lower surface are the side surfaces.

Figure 2:
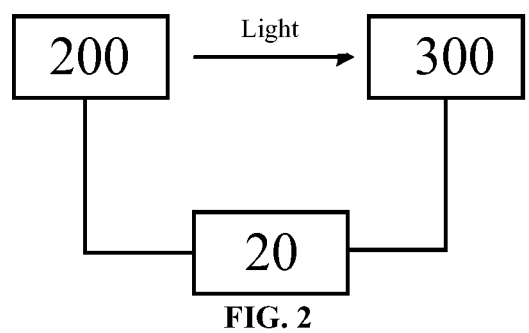
FIG. 2 shows a schematic diagram of the operating principles of built-in compensation in a display substrate according to an embodiment of the present disclosure.

FIG. 2 shows a schematic diagram of the operating principles of built-in compensation in the display substrate illustrated in FIG. 1B.

In at least some embodiments, the display substrate 10 (or a display panel incorporating the display substrate) may include a controller 20. The controller 20 may be bonded to the display substrate 10. The display substrate 10 includes a display region and a non-display region. The plurality of pixel regions are provided in the display region of the display substrate 10. The bonding region is provided in the non-display region of the display substrate 10. During bonding, the controller 20 is bonded to one end of a flexible circuit board, and the other end of the flexible circuit board that does not contain the controller 20 is bonded to the bonding region of the display substrate 10. The controller 20 is configured to control the circuits of the display substrate 10 (for example, the circuits for the pixel units 200, the photodetectors 300, et cetera).

The configurations of the controller 20 are not particularly limited. The controller 20 may be configured in any appropriate manner known to a person of ordinary skill in the art. For example, the controller may be a central processing unit (CPU), a digital signal processor, a microcontroller, a programmable logic controller, and the like. It is also understood that additional components and/or accessories may be provided in the controller 20 of the present disclosure without departing from the spirit and scope of the present disclosure. A person of ordinary skill in the art would readily appreciate that the configuration of the controller 20 is not limited to the embodiments described in this present disclosure or shown in the figures, and the controller 20 may include any additional components and/or accessories that are typically found in a controller 20 and/or that are provided according to any particular purpose for which the controller 20 is intended. For example, the controller 20 may include a CPU, a memory, and a power source. The controller 20 may also include lead wires, signal lines, and the like that enable the power and/or signal transmission functions of the controller 20. The controller 20 may also include hardware circuits, programmable hardware devices, and the like. The hardware circuits are not particularly limited, and may be a very-large-scale integration (VLSI) device or a gate array, or a semiconductor device such as a programmable logic device or a transistor, or any appropriate component(s) known to a person of ordinary skill in the art. The programmable hardware devices are not particularly limited, and may be a field-programmable gate array, a programmable logic array, a programmable logic controller, and the like.

In addition, the circuit configurations for the pixel unit 200 and the photodetector 300 are not particularly limited, and may be any appropriate configuration known to a person of ordinary skill in the art and/or suitable for any particular purpose for which the pixel unit 200 and/or the photodetector 300 is intended.

Figure 3A:
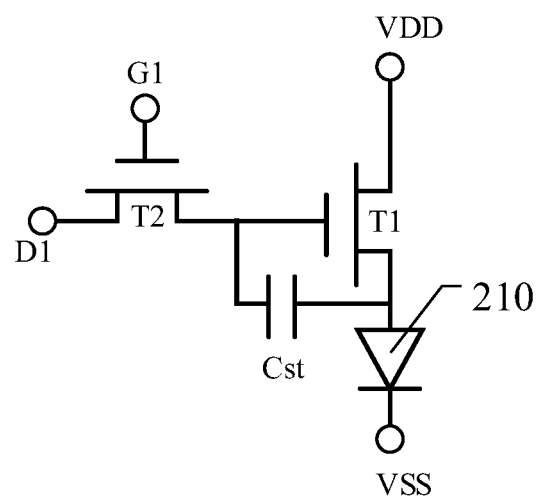
FIGS. 3A and 3B show circuit designs for a pixel unit in a display substrate photodetector according to embodiments of the present disclosure.
Figure 3B:
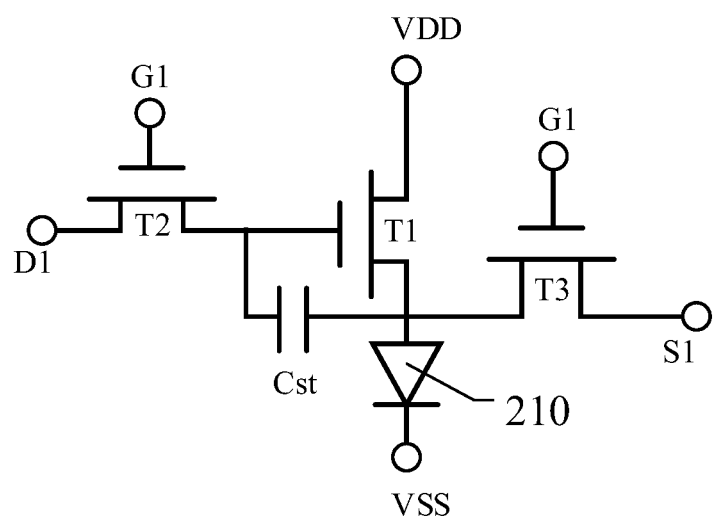

FIGS. 3A and 3B show circuit designs for a pixel unit in a display substrate according to embodiments of the present disclosure.

In FIG. 3A, the pixel unit 200 is provided with a pixel circuit having the 2T1C structure. The pixel circuit 2T1C comprises a first switch T1, a capacitor Cst, and a second switch T2. The first switch T1 and the second switch T2 may each be a thin film transistor. The term "2T1C" refers to two (2) transistors and one (1) capacitor. The second switch T2 may further comprise a second gate electrode that is coupled to a scan line, and may be configured to receive the first scan signal G1. The second switch T2 may further comprise a second source electrode that is coupled to a data line, and may be configured to receive a first data signal D1. The second switch T2 may further comprise a second drain electrode that is coupled to the first gate electrode of the first switch T1. The first switch T1 may comprise a first source electrode that is coupled to the first voltage terminal, and may be configured to receive the drive voltage VDD (a high voltage). The first switch T1 may further comprise a first drain electrode that is coupled to the light-emitting device 210 via a first electrode (for example, the anode). The first switch T1 may be configured as a drive transistor. The capacitor Cst is connected at a first end to the second drain electrode of the second switch T2 and the first gate electrode of the first switch T1, and at a second end to the first drain electrode of the first switch T1. A second electrode of the light-emitting device 210 (for example, the cathode), which is not coupled to the first switch T1, may be coupled to the signal line having a low voltage VSS (for example, a ground). When the first scan signal G1 is transmitted via the scan line to activate the second switch T2, the drive circuit charges the capacitor Cst via the second switch T2 in accordance with the first data signal D1 transmitted via the data line. The first data signal D1 is thus stored in the capacitor Cst. The stored first data signal D1 controls the conductivity of the first switch T1, and in so doing, controls the current that flows through the first switch T1 for driving the light-emitting device 210 to emit light.

In FIG. 3B, the pixel unit 200 comprises the pixel circuit 2T1C as illustrated in FIG. 3A, and further comprises a third switch T3. The third switch T3 comprises a third source electrode that is coupled to the first drain electrode of the first switch T1, and also coupled to the anode of the light-emitting device 210. The third switch T3 operates synchronously with the second switch T2. That is, the second and third switches T2, T3 are either both turned on or both turned off. The third switch T3 may further comprise a third gate electrode that is coupled to the scan line, and may be configured to receive the first scan signal G1. The third switch T3 may further comprise a third drain electrode that is coupled to the controller 20. When the third switch T3 is turned on, the controller is configured to detect the drive voltage (or current) supplied to the light-emitting device 210 via the third switch T3, and to acquire a first detection signal S1. Based on the first detection signal S1, the controller 20 is configured to evaluate the drive voltage supplied to the light-emitting device 210. If the controller 20 determines that the drive voltage is below a predetermined value, the controller 20 is configured to adjust the first data signal D1 from the pixel circuit 2T1C, and provide a proper compensation for the drive voltage for the light-emitting device 210.

It is understood that the structure and configuration of the pixel circuit are not limited to the 2T1C circuit structure illustrated in FIGS. 3A and 3B. The pixel circuit may be configured in any appropriate manner known to a person of ordinary skill in the art, for example, 4T1C (four (4) transistors, one (1) capacitor), 4T2C (four (4) transistors, two (2) capacitors), or any other appropriate configuration depending on the particular purpose for which the pixel circuit is intended. In addition, FIG. 1B shows a portion of the pixel circuit, so that, for example, the first switch 220 in FIG. 1B may serve as the first switch T1 in FIGS. 3A and 3B.

Figure 4A:
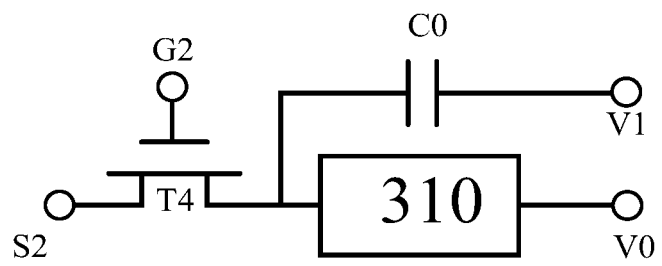
FIGS. 4A and 4B show circuit designs for a photodetector in a display substrate according to embodiments of the present disclosure.
Figure 4B:
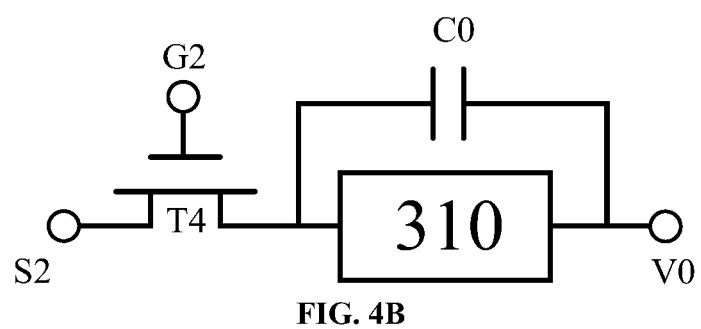

FIGS. 4A and 4B show circuit designs for a photodetector in a display substrate according to embodiments of the present disclosure.

In FIG. 4A, the photodetector 300 is provided with a circuit that comprises a fourth switch T4 and a capacitor C0. The fourth switch T4 comprises a fourth source electrode that is coupled to a first end of the photodetecting device 310. The fourth switch T4 may further comprise a fourth drain electrode that is coupled to the controller 20. A second end of the photodetecting device 310 that is not coupled to the fourth source electrode of the fourth switch T4 is coupled to a signal line having a constant voltage VO (for example, a ground). The capacitor C0 has a first end that is coupled to the fourth source electrode of the fourth switch T4, and a second end that is coupled to the signal line having the constant voltage VO (for example, a ground). The fourth switch T4 may further comprise a fourth gate electrode that is coupled to the scan line, and may be configured to receive a second scan signal G2 that controls the fourth switch T4, including turning the fourth switch T4 on or off. When the light-emitting device 210 of the pixel unit 200 is emitting light, the photodetecting device 310 receives the emitted light from the light-emitting device 210 and produces a corresponding number of carriers. The photodetecting device 310 is thus configured to convert a light signal corresponding to the intensity of the emitted light into an electrical signal, and store the electrical signal in the capacitor C0. When the fourth switch T4 is turned on, the stored electrical signal may be read by the controller 20, and based on the stored electrical signal, acquire the second detecting signal S2 corresponding to the intensity of light emitted by the light-emitting device 210. Based on the second detecting signal S2, the controller is configured to evaluate the operating status of the light-emitting device 210. For example, if the controller 210 determines that the intensity of the emitted light, which corresponds to the grayscale of the pixel region, is below a predetermined value, the controller 20 is configured to adjust the first data signal D1 from the pixel circuit 2T1C, and provide a proper compensation for the drive voltage for the light-emitting device 210.

In FIG. 4B, the photodetector 300 comprises the fourth switch T4 and the capacitor C0. The fourth switch T4 comprises a fourth source electrode that is coupled to a first end of the photodetecting device 310, and a fourth drain electrode that is coupled to the controller 20. A first end of the capacitor C0 is coupled to the fourth source electrode of the fourth switch T4. A second end of the photodetecting device 310, which is not coupled to the fourth source electrode of the fourth switch T4, is connected a second end of the capacitor C0, which is also not coupled to the fourth source electrode of the fourth switch T4. The second end of the photodetecting device 310 is also coupled to a signal line having a constant voltage VO (for example, a ground). The fourth switch T4 may further comprise a fourth gate electrode that is coupled to the scan line, and may be configured to receive a second scan signal G2 that controls the fourth switch T4, including, for example, the turning on or off of the fourth switch T4. The operation of the circuit of the photodetector 300 in adjusting and compensating the emitted light from the light-emitting device 210 is as discussed above.

It is understood that the structure and configuration of the circuit of the photodetector 300 are not limited to the structure illustrated in FIGS. 4A and 4B. The circuit of the photodetector 300 may be configured in any appropriate manner known to a person of ordinary skill in the art. In addition, FIGS. 1A and 1B show a portion of the circuit of the photodetector 300, so that, for example, the fourth switch 330 in FIGS. 1A and 1B may serve as the fourth switch T4 in FIGS. 4A and 4B.

The photodetector 300 is configured to detect the light emission intensity of the light-emitting device 210, and based on the acquired light emission intensity, the photodetector 300 is configured to apply, for example, via the controller 20, an appropriate compensation to the drive voltage for the light-emitting device 210 in the pixel unit. Moreover, detection and compensation are not affected by external factors such as the threshold voltage difference between the switches, the natural aging of the light-emitting device, and the like. The sensitivity of the detection is therefore improved, which can in turn produce accurate compensations. In addition, the present disclosure either obviates the need for a compensation circuit within the pixel circuit of the pixel unit, or at the very least, greatly simplifies the design and construction of the compensation circuit. This in turn makes it possible to simplify the structure of the pixel unit, making easy the manufacture of the display substrate and reducing manufacturing costs.

Figure 5A:
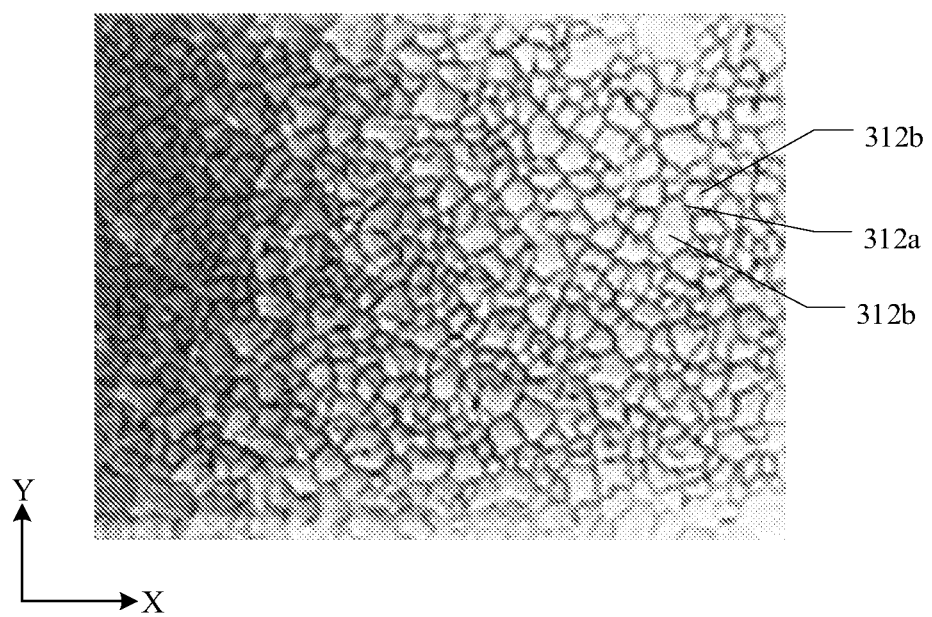
FIG. 5A shows a scanning electron microscope (SEM) image of a partial top view of a light-trapping layer in a photodetector according to an embodiment of the present disclosure.
Figure 5B:
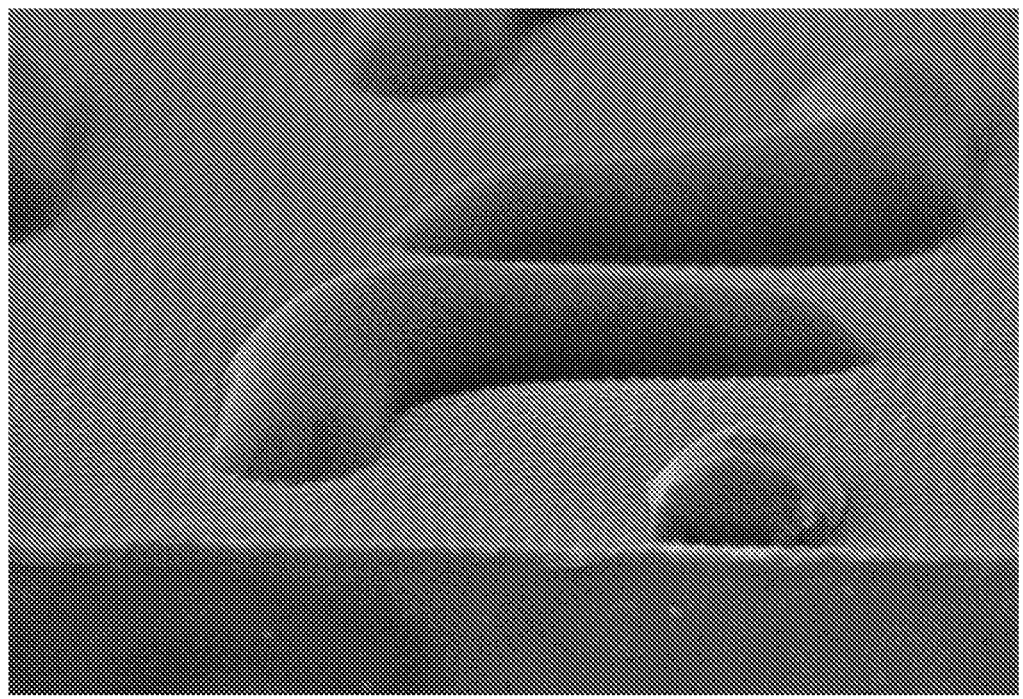
FIGS. 5B and 5C show SEM images of a light-trapping layer in a photodetector according to an embodiment of the present disclosure.
Figure 5C:
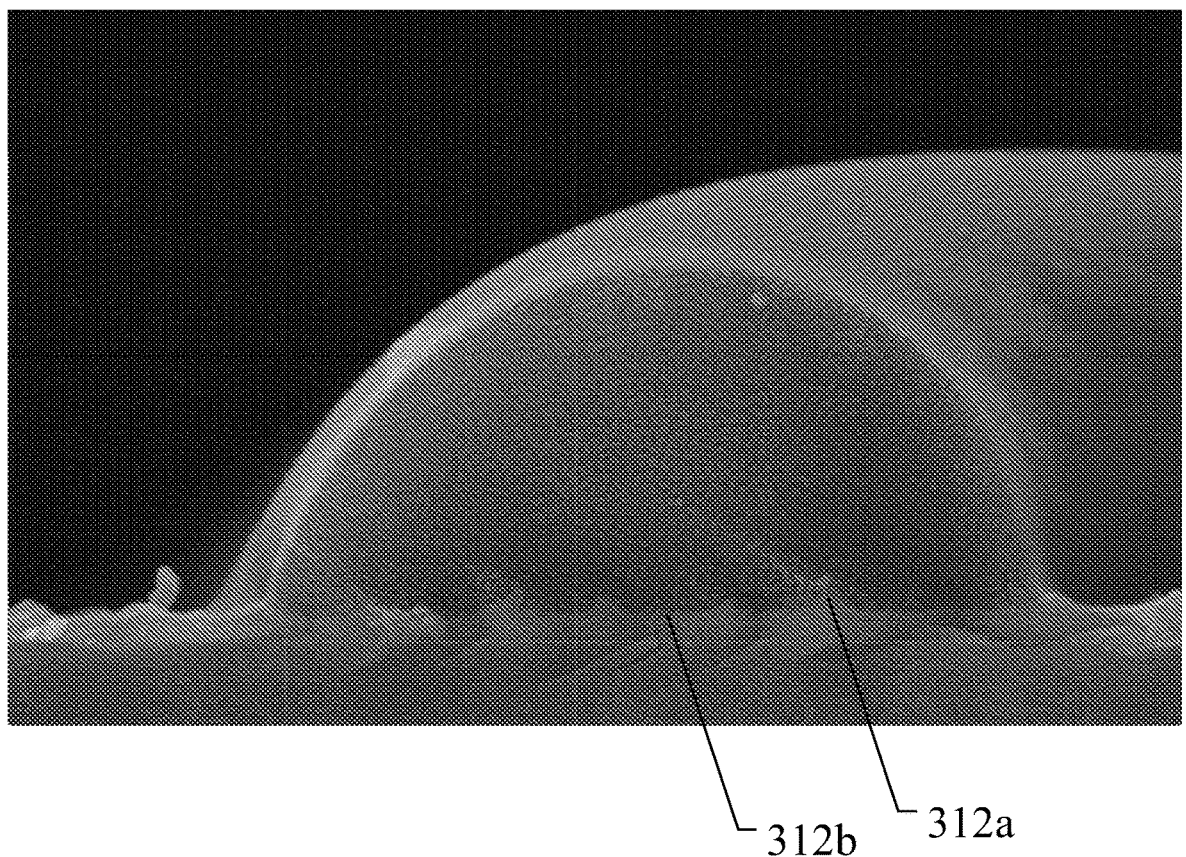
Figure 5D:
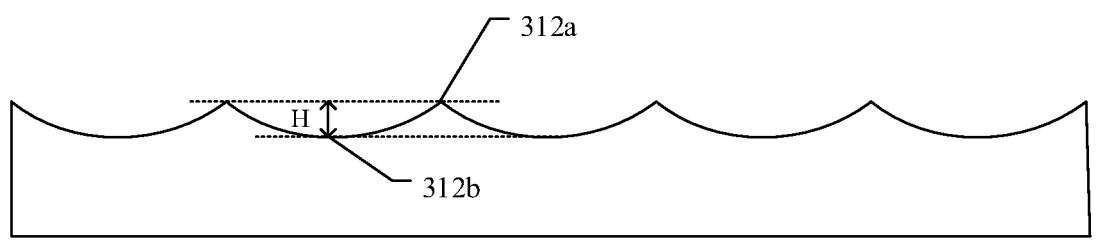
FIG. 5D shows a schematic cross-sectional view of a light-trapping layer in a photodetector according to an embodiment of the present disclosure.

FIG. 5A shows a SEM image of a partial top view of a light-trapping layer according to an embodiment of the present disclosure. FIGS. 5B and 5C show SEM images of a light-trapping layer in a photodetector according to an embodiment of the present disclosure. More particularly, FIG. 5B shows a SEM image, at 10.0 k magnification, of a surface of a light-trapping layer according to an embodiment of the present disclosure. FIG. 5C shows a SEM, at 50.0 k magnification, of a cross-section of a light-trapping layer according to an embodiment of the present disclosure. FIG. 5D shows a schematic cross-sectional view of a light-trapping layer in a photodetector according to an embodiment of the present disclosure.

The photodetecting device 310 includes a light-sensitive layer 311, and a light-trapping layer 312 between the light-sensitive layer 311 and the base substrate 100. One surface of the light-trapping layer 312 faces the light-sensitive layer 311, for example, as shown in FIGS. 1A and 1B.

The surface of the light-trapping layer 312 opposite from the base substrate 100, and that faces the light-sensitive layer 311, is an uneven surface comprising a plurality of raised portions 312a and a plurality of recessed portions 312b, for example, as shown in FIGS. 5A to 5D. FIG. 5B shows a SEM image, at 10.0 k magnification, of a surface of a light-trapping layer according to an embodiment of the present disclosure. In FIG. 5B, the oversized objects are photoresist resins on the surface of the light-trapping layer, and the raised and recessed portions are visible as organized arrays on the surface. FIG. 5C shows a SEM, at 50.0 k magnification, of a cross-section of a light-trapping layer according to an embodiment of the present disclosure. FIG.

5C shows the plurality of raised portions 312a and the plurality of recessed portions 312b.

The recessed portions 312b may be formed as dents, grooves, and the like. However, the structure and configuration of the light-trapping layer are not particularly limited. The light-trapping layer may be configured in any appropriate manner known to a person of ordinary skill in the art, so long as the light-trapping layer is capable of trapping light and lengthening the optical path of the emitted light in the light-sensitive layer.

In at least some embodiments, the light-trapping layer 312 is composed of a polycrystalline material (for example, polycrystalline silicon (P—Si)). More particularly, a layer of amorphous material (for instance, amorphous silicon (a-Si)) is deposited on the base substrate and then annealed (for instance, laser annealing), causing the amorphous material to crystallize into a polycrystalline material (for instance, polycrystalline silicon). The crystallization process produces unevenness in the surface of the layer. More particularly, the surface is formed with a plurality of raised portions (for instance, the raised portions 312a in FIGS. 5B and 5D), and the spaces between neighboring raised portions are recessed relative to the raised portions (for instance, the recessed portions 312b in FIGS. 5B and 5D). For example, as shown in FIGS. 5B to 5D, the raised portions 312a are formed at positions where neighboring recessed portions 312b meet. Since the raised and recessed portions are formed naturally when annealing the amorphous material, the production of the light-trapping layer according to the present disclosure is simple and inexpensive.

The topography of the surface of the light-trapping layer (for instance, the shape and/or geometry of the recessed and raised portions, and/or the distribution and/or arrangement of those portions) will vary depending on how the polycrystalline material (for instance, polycrystalline silicon) is obtained. In at least some embodiments, the amorphous material layer is subject to selective and localized laser annealing using a micro lens array (MLA) mask. The amorphous material layer undergoes localized crystallization to produce the polycrystalline light-trapping layer of the present disclosure, having an uneven surface with an ordered pattern of recessed and raised portions. Obtaining the polycrystalline material through selective and localized crystallization of the amorphous material can produce a more ordered pattern of recessed and raised portions on the surface of the light-trapping layer, which can in turn increase the effectiveness of the light-trapping layer. For example, as shown in FIGS. 5A to 5C, the recessed portions 312b have a substantially square shape, and the arrangement of the recessed portions 312b and the raised portions 312a are more uniform and regular. Under these circumstances, the raised and recessed portions 312a, 312b may act like photonic crystals, and give rise to surface plasmon resonance effects that can enhance the absorption of light in the light-sensitive layer.

As shown in FIG. 5D, in at least some embodiments, an average depth H of the plurality of recessed portions 312b is between 2 to 10 nm. The depth H of a recessed portion 312b is measured in a direction perpendicular to the base substrate 100, as shown in FIG. 5D. In at least some embodiments, the average depth H of the recessed portions 312b is between 3 to 5 nm. For example, the average depth H of the recessed portions 312b may be 3.5 nm, 4 nm, or 4.5 nm.

In at least some embodiments, an average width of the plurality of recessed portions 312b is 100 nm or less. The width of a recessed portion 312b is measured in a direction parallel to the base substrate 100. In at least some embodiments, the average width of the recessed portions 312b is 20-60 nm. For example, the average width of the recessed portions 312b may be 30 nm or less, 40 nm or less, 47 nm or less, 50 nm or less, or 55 nm or less. In FIG. 5, the average width of the recessed portions 312b is about 47 nm. However, the dimensions of the raised and recessed portions 312a, 312b are not particularly limited. It is understood that the raised portions and/or the recessed portions may have any appropriate dimensions known to a person of ordinary skill in the art depending on need.

In at least some embodiments, the light-trapping layer 312 may be an organic layer. As an organic layer, the light-trapping layer may be composed any appropriate organic material known to a person of ordinary skill in the art, including, but not limited to, a resin material. The organic material is deposited on the base substrate 100 to form an organic layer, and nanoimprint lithography is performed on the organic layer to form recessed and raised portions in the organic layer, so as to obtain the light-trapping layer 312. In some embodiments, the organic layer may be patterned by any appropriate process known to a person of ordinary skill in the art to form recessed and raised portions in the organic layer, and obtain the light-trapping layer 312. The dimensions of the recessed and/or raised portions in an organic light-trapping layer 312 thus formed may be as described above.

In at least some embodiments, the light-trapping layer 312 may be an inorganic layer. As an inorganic layer, the light-trapping layer may be composed any appropriate inorganic material known to a person of ordinary skill in the art, including, but not limited to, a metal, a metal oxide, and the like. The inorganic material is deposited on the base substrate 100 to form an inorganic layer, which is then patterned by any appropriate process known to a person of ordinary skill in the art to form recessed and raised portions in the inorganic layer, and obtain the light-trapping layer 312. The dimensions of the recessed and/or raised portions in an inorganic light-trapping layer 312 thus formed may be as described above.

The photodetecting device 310 of the photodetector 300 may comprise a first electrode 313 and a second electrode 314. The first electrode 313, the light-sensitive layer 311, and the second electrode 314 are arranged in this order on the base substrate 100. The first electrode 313 is closer to the base substrate 100 than the light-sensitive layer 311 or the second electrode 314. The first electrode 313 overlaps at least partially with the light-trapping layer 312. For example, as shown in FIGS. 1A and 1B, the photodetecting device 310 comprises a first electrode 313 and a second electrode 314. The first electrode 313, the light-sensitive layer 311, and the second electrode 314 are provided in this order on the base substrate 100. The first electrode 313 overlaps with the light-trapping layer 312. The first electrode 313 may be coupled to the fourth source electrode of the fourth switch T4. The fourth switch T4 is shown in FIGS. 4A and 4B, and is shown as fourth switch 330 in FIGS. 1A and 1B. The second electrode 314 may be coupled to a signal line having a constant voltage V0 (for example, a ground). The signal line is shown in FIGS. 4A and 4B, and is shown as signal line 350 in FIGS. 1A and 1B.

In some embodiments, the first electrode 313 and the light-trapping layer 312 are formed as separate layers, for example, as shown in FIGS. 1A and 1B. In other embodiments, where the light-trapping layer 312 is composed of an electrically conductive material (for example, if the light-trapping layer is composed of a polycrystalline silicon), the first electrode 313 and the light-trapping layer 312 may be formed as an integral structure, so as to simplify construction of the display substrate and reduce the attendant manufacturing costs.

In the display substrate illustrated in FIG. 1B, the first electrode 313 and the light-trapping layer 312 are formed as separate layers. In embodiments where the first electrode 313 and the light-trapping layer 312 are formed as separate layers, the order in which the first electrode 313 and the light-trapping layer 312 are formed on the base substrate 100 is not particularly limited. In at least some embodiments, the first electrode 313 is between the light-trapping layer 312 and the base substrate 100. The light-trapping layer 312 is electrically conductive. For example, as shown in FIG. 1B, the first electrode 313 is between the light-trapping layer 312 and the base substrate 100. The light-trapping layer 312 is configured to be electrically conductive to maintain the electrical functions of the photodetector 300. The light-trapping layer 312 may be composed of polycrystalline silicon. The formation of the light-trapping layer 312 may be as described above. Polycrystalline silicone exhibits a certain level of electrical conductivity. The conductivity of a light-trapping layer 312 composed of polycrystalline silicon may be adjusted by doping the layer with an appropriate amount of dopants. At low and moderate dopant concentrations, the conductivity of the light-trapping layer composed of polycrystalline silicon may be lower. At high dopant concentration, the conductivity of the light-trapping layer composed of polycrystalline silicon may be higher. Increasing the conductivity of the light-trapping layer can reduce the drive voltage of the photodetector.

Figure 6:
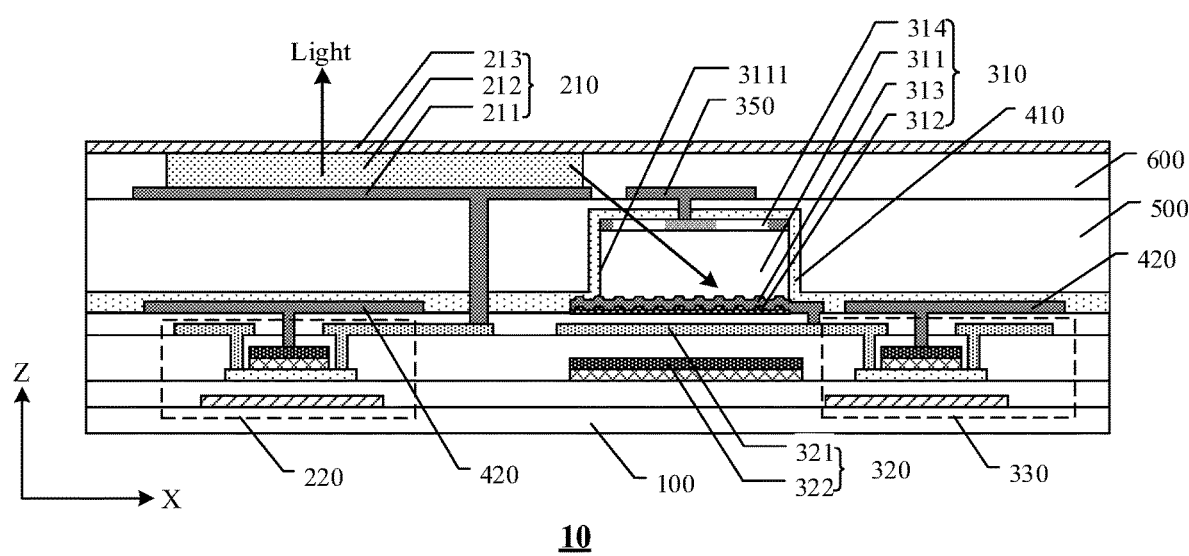
FIG. 6 shows a schematic cross-sectional view of a display substrate according to another embodiment of the present disclosure.

FIG. 6 shows a schematic cross-sectional view of a display substrate according to another embodiment of the present disclosure. More specifically, FIG. 6 shows a cross-section of a pixel region in a display substrate according to an embodiment of the present disclosure.

As shown in FIG. 6, the light-trapping layer 312 is between the first electrode 313 and the base substrate 100. Also as shown in FIG. 6, at least one surface of the first electrode 313 is formed to be complementary to the surface of the light-trapping layer 312. The surface of the light-trapping layer 312 is uneven, and comprises a plurality of recessed portions and a plurality of raised portions. Therefore, at least the surface of the first electrode 313 that is contact with the light-trapping layer 312 is formed with a plurality of recessed portions and a plurality of raised portions that complement the surface contours of the light-trapping layer 312. In at least some embodiments, the first electrode 313 may be formed by a conformal coating process, so that the first electrode 313 conforms to the surface contours of the light-trapping layer 312. At the position of a raised portion on the surface of the light-trapping layer 312, a complementary recessed portion is formed at the corresponding position on the side of the first electrode 313 that is in contact with the light-trapping layer 312. At the position of a recessed portion on the surface of the light-trapping layer 312, a complementary raised portion is formed at the corresponding position on the side of the first electrode 313 that is in contact with the light-trapping layer 312.

In at least some embodiments, the surface of the first electrode 313 that is opposite from the light-trapping layer 312 may also be formed with a plurality of recessed portions and a plurality of raised portions in a complementary manner to the light-trapping layer 312, for example, as shown in FIG. 6. More particularly, at the position of a raised portion on the surface of the light-trapping layer 312, a complementary raised portion is formed at the corresponding position on the side of the first electrode 313 opposite from the light-trapping layer 312. At the position of a recessed portion on the surface of the light-trapping layer 312, a complementary recessed portion is formed at the corresponding position on the side of the first electrode 313 opposite from the light-trapping layer 312.

Unevenness in the surfaces of the first electrode 313 contributes to the light-trapping effect. That is, the complementary recessed and raised portions in the surfaces of the first electrode 313 may further lengthen the optical path of an incident light in the light-sensitive layer 311, so as to further increase the absorption of the light by the light-sensitive layer 311. Increasing light absorption also increases the sensitivity and accuracy of the photo-detecting 310 to further improve the functions and display quality of the display substrate.

In embodiments where the light-trapping layer 312 is between the first electrode 313 and the base substrate 100, the light-trapping layer 312 may be composed of polycrystalline silicon. After the light-trapping layer 312 is formed, the polycrystalline silicon may be doped with an appropriate dopant. Polycrystalline silicon exhibits a certain level of electrical conductivity. The level of conductivity may be adjusted by adjusting the dopant and/or the amount of the dopant. At low and moderate dopant concentrations, the conductivity of the light-trapping layer composed of polycrystalline silicon may be lower. At high dopant concentration, the conductivity of the light-trapping layer composed of polycrystalline silicon may be higher. As compared to a light-trapping layer that has low or no electrical conductivity, the sheet resistance of the first electrode and an electrically conductive light-trapping layer is reduced, which can reduce the drive voltage of the photodetector and therefore, the power consumption.

In some embodiments, the photodetector 300 may be formed without a dedicated light-trapping layer. More particularly, the surface of the light-sensitive layer 311 facing the first electrode 313 may be formed with the plurality of raised portions and the plurality of recessed portions. The light-sensitive layer 311 may thus be configured to provide light-trapping functions.

The structure and configuration of the photodetecting device 310 of the photodetector 300 are not particularly limited. The photodetecting device may be structured and configured in any appropriate manner known to a person of ordinary skill in the art, so long as the photodetecting device is capable of generating current and/or voltage signals in accordance with the emission intensity of the light-emitting device 210.

For example, in at least some embodiments, the light-sensitive layer 311 may comprise a PN junction. More particularly, the light-sensitive layer 311 comprises a p-type semiconductor layer and an n-type semiconductor layer. The p-type semiconductor layer is closer to the base substrate 100 than the n-type semiconductor layer. For example, in the display substrate illustrated in FIG. 1B, the light-sensitive layer 311 comprises the p-type semiconductor layer and the n-type semiconductor layer are arranged in this order on the base substrate 100.

In other embodiments, the light-sensitive layer 311 may comprise a PIN junction. The light-sensitive layer 311 comprises a p-type semiconductor layer, an intrinsic semiconductor layer, and an n-type semiconductor layer. The p-type semiconductor layer is closer to the base substrate 100 than the intrinsic semiconductor layer or the n-type semiconductor layer. For example, as shown in FIG. 7, the light-sensitive layer 311 comprises a p-type semiconductor layer 311a, an intrinsic semiconductor layer 311b, and an n-type semiconductor layer 311c arranged in this order on the base substrate 100.

The photodetecting device of the photodetector may comprise a first electrode and a second electrode. For example, as shown in FIG. 1, the photodetecting device 310 comprises a first electrode 313 and a second electrode 314. The materials for forming the first electrode and the second electrode are not particularly limited. It is understood that the first electrode and the second electrode may be formed of any appropriate material known to a person of ordinary skill in the art, so long as the second electrode is capable of transmitting light and light emitted by the light-emitting device 210 can travel through the second electrode to the light-sensitive layer 311. For example, as shown by the solid arrow in FIG. 1B, light emitted by the light-emitting device 210 is propagated through the second electrode 314 to the light-sensitive layer 311.

The first electrode 313 may be composed of a metal. The first electrode 313 may comprise a single layer or a plurality of layers. For example, the first electrode 313 may comprise a single aluminum layer, a single molybdenum layer, or a three-layered structure comprising a layer of aluminum between two layers of molybdenum. The first electrode 313 according to the present disclosure is configured to reflect light, so that light transmitted through the light-sensitive layer is reflected back toward the light-sensitive layer. This can increase the absorption of the light by the light-sensitive layer, and improve the sensitivity of the photodetecting device.

Figure 7:
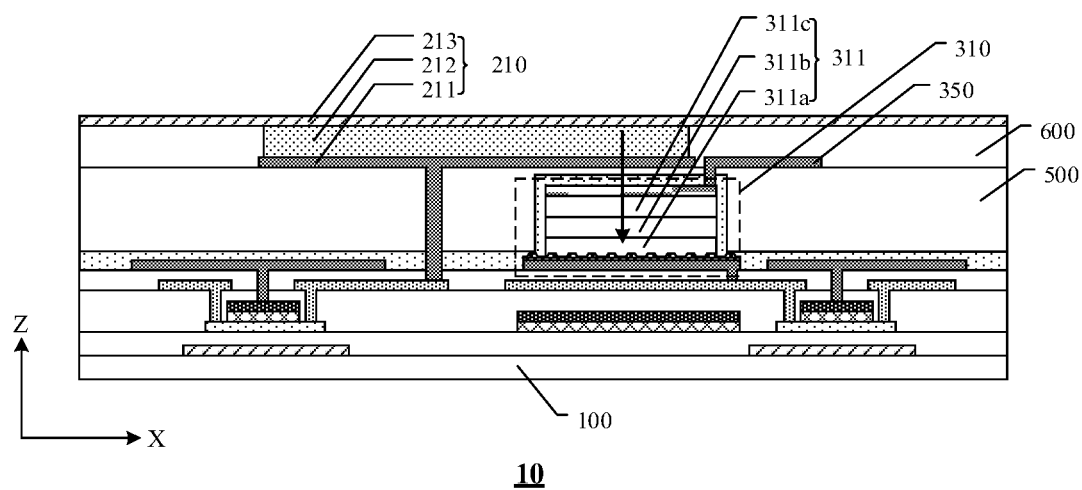
FIG. 7 shows a schematic cross-sectional view of a display substrate according to another embodiment of the present disclosure.

In at least some embodiments, for example, as shown in FIGS. 1B, 6, and 7, the first electrode 313 may be formed of the same material as the source and drain electrodes of the switch (for example, the fourth switch 330 in FIGS. 1A and 1B). Using the same material to form the first electrode and the source and drain electrodes of the switch simplifies manufacturing and reduces cost.

The second electrode 314 may be composed of an electrically conductive material. The second electrode 314 is transparent or substantially transparent, so as to be capable of transmitting light emitted by the light-emitting device to the light-sensitive layer 311. For example, the second electrode 314 may be composed of a conductive inorganic metal oxide (for instance, indium tin oxide (ITO) and the like); a metal (gold, copper, silver, platinum, and the like); a conductive organic polymer (for instance, PEDOT:PSS (poly (3,4-ethylenedioxythiophene)-poly(styrene sulfonate)), PANI (polyaniline), and the like). In embodiments where the second electrode 314 is composed a metal, the thickness of the second electrode 314 is configured to allow light to pass through.

In at least some embodiments, the display substrate comprises a first barrier layer. The light-sensitive layer comprises a side surface that is oriented in direction perpendicular to the base substrate. The first barrier layer covers at least a portion of the side surface of the light-sensitive layer.

For example, as shown in FIG. 6, the display substrate 10 comprises a first barrier layer 410, and the light-sensitive layer 311 comprises a side surface 3111 that is oriented in a direction perpendicular to the base substrate 100. The first barrier layer 410 covers at least a portion of the side surface 3111. As shown in FIG. 6, during the fabrication of the display substrate, after the photodetecting device 310 is formed on the base substrate 100, the first barrier layer 410 may be formed to cover at least a portion of the photodetecting device 310. That is, the first barrier layer 410 covers at least a portion of each of the side surface 3111 of the light-sensitive layer 311, the top surface of the light-sensitive layer 311, and the second electrode 314. The first barrier layer 410 functions to prevent ions in other layers of the display substrate (for example, hydrogen ions generated during fabrication of the flattening layer 500 discussed below) from contaminating the light-sensitive layer 311, so as to protect the contaminants from interfering with the functions of the light-sensitive layer 311.

The first barrier layer 410 may be composed of an inorganic material, including, but not limited to, tantalum nitride, yttrium oxide, niobium oxynitride, and the like. The inorganic material is preferably capable of forming a layer having a high density, so as to better bar contaminants from entering the light-sensitive layer.

In at least some embodiments, each pixel region of the display substrate comprises a plurality of switches. The plurality of switches are provided below the photodetecting device and the light-emitting device. For example, as shown in FIG. 1B, the switches 220, 330 are provided below the light-emitting device 210 and the photodetecting device 310, respectively. During the fabrication of the display substrate, the plurality of switches may be formed on the base substrate before forming the photodetecting device 310 and the light-emitting device 210. The configuration of the switches in the pixel unit and the photodetector may be as illustrated by the switches T1, T2, T3, T4 in FIGS. 3A, 3B, 4A, and 4B. The plurality of switches may each be a thin film transistor. Each thin film transistor may be configured in any appropriate manner known to a person of ordinary skill in the art, including, but not limited to, as a top gate thin film transistor, a bottom gate thin film transistor, or a double gate thin film transistor.

FIGS. 1B and 6 show the first switch 220 in the pixel unit 200, and the fourth switch 330 in the photodetector 300. The first switch 220 and the fourth switch 330 may each be a top-gate thin film transistor. The first switch 220 corresponds to the first switch T1 in FIGS. 3A and 3B. The fourth switch 330 corresponds to the fourth switch T4 in FIGS. 4A and 4B.

In embodiments where the switches are thin film transistors, the structures and configurations of the switches are not particularly limited. The switches may be structured and configured in any appropriate manner known to a person of ordinary skill in the art, depending on need and/or the intended purpose for the display substrate. In some embodiments where the switches are thin film transistors, each switch may comprise a light-blocking layer, a buffer layer, an active layer, a gate insulating layer, a gate electrode, a dielectric layer, and a source/drain electrode layer (comprising a source electrode and a drain electrode).

In at least some embodiments, the display substrate comprises a second barrier layer. A switch is provided between the second barrier layer and the base substrate, and overlaps partially with the second barrier layer. The orthographic projection of the switch (or the active layer of the switch in embodiments where the switch is a thin film transistor) on the base substrate is within the orthographic projection of the second barrier layer on the base substrate. As shown in FIGS. 1B and 6, a second barrier layer 420 is provided on each of the first switch 220 of the pixel unit 210 and the fourth switch 330 of the photodetector 300. The second barrier layer 420 overlaps with each of the first switch 220 and the fourth switch 330. The second barrier layer 420 functions to prevent ions (for example, hydrogen ions) generated during fabrication of the light-sensitive layer or other layers of the display substrate from entering the switches (or the active layers of the switches in embodiments where the switches are thin film transistors) and interfering with the electrical performances of the switches. In some embodiments, the second barrier layer and the first electrode may be provided in the same layer, and may be composed of the same material, so that the second barrier layer and the first electrode may be formed concurrently in a single step (for example, in a single deposition (by vapor deposition or the like), or in a single patterning step). This can in turn simplify manufacturing and reduce cost.

In at least some embodiments where the second barrier layer and the first electrode are formed in the same layer and are composed of the same material, or the second barrier layer is composed of an electrically conductive material, the second barrier layer may be coupled to the gate electrodes of the switches. This configuration can prevent parasitic capacitance between the second barrier layer and the electrodes (for example, the gate electrodes) of the switches, which can in turn minimize or eliminate interferences from the second barrier layer on the electrical performances of the switches. In some embodiments, each switch in the display substrate may be provided with a second barrier layer. In other embodiments, only a portion of the switches in the display substrate are provided with a second barrier layer. In some embodiments, in each switch that is provided with a second barrier layer, the gate electrode of the switch is coupled to the corresponding second barrier layer. In other embodiments, only in a portion of the switches that are provided with a second barrier layer is the gate electrode coupled to the corresponding second barrier layer. Adjacent second barrier layers may be spaced apart from each other to prevent short-circuiting between adjacent switches. For example, as shown in FIG. 6, a second barrier layer 420 is provided on each of the first switch 220 of the pixel unit 200 and the fourth switch 330 of the photodetector. Each second barrier layer 420 is coupled to the gate electrode of the corresponding first switch 220 or fourth switch 330.

In at least some embodiments, the photodetector 300 may comprise a first capacitor. The first capacitor comprises a fifth electrode and a sixth electrode. The sixth electrode is between the fifth electrode and the base substrate. The first capacitor may correspond to the capacitor C0 in FIGS. 4A and 4B. That is, the first capacitor may be configured and coupled to other components in the display substrate in the same manner as illustrated in FIGS. 4A and 4B for capacitor C0. As shown in FIGS. 1 and 6, the photodetector 300 comprises the first capacitor 320, which comprises the fifth electrode 321 and the sixth electrode 322 arranged in this order on the base substrate 100.

In at least some embodiments, the fifth electrode is formed in the same layer as the source and drain electrodes of a switch (for example, the fourth switch 330), and is composed of the same material as the source and drain electrodes of the switch. As shown in FIGS. 1A, 1B, and 6, one of the source and drain electrodes of the fourth switch 330 extends to overlap with the sixth electrode 322, and the first capacitor 320 and the fifth electrode 321 are formed in the overlapped portion between the sixth electrode 322 and the one of the source of the drain electrodes of the fourth switch 330. This configuration makes it possible to simplify construction and reduce manufacturing costs.

In at least some embodiments, the sixth electrode is formed in the same layer as the gate electrode of a switch (for example, the fourth switch 330), and is composed of the same material as the gate electrode of the switch. This configuration similarly makes it possible to simplify construction and reduce manufacturing costs.

In at least some embodiments, the first capacitor and the fifth electrode are formed as a integrate structure with the light-trapping layer or the first electrode. In such embodiments, the source and drain electrodes of the fourth switch do not need to overlap with the sixth electrode. This can reduce the thickness of the photodetector, simplify the construction of the display substrate, and reduce manufacturing costs.

In at least some embodiments, the orthographic projection of the light-sensitive layer of the photodetecting device on the base substrate is within the orthographic projection of the first capacitor on the base substrate. As shown in FIGS. 1A, 1B, and 6, the orthographic projection of the light-sensitive layer 311 on the base substrate 100 is within the orthographic projection of the first capacitor 320 on the base substrate 100. This configuration reduces the risk that, during fabrication, step difference caused by the switch and the first capacitor 320 would adversely affect the light-sensitive layer 311 and other components of the photodetecting device 310, so as to better ensure the quality and functions of the photodetecting device 310.

The relative positions of the photodetecting device and the light-emitting device on the base substrate, in the vertical direction perpendicular to the base substrate, are not particularly limited, so long as light emitted by the light-emitting device can enter the light-sensitive layer of the photodetecting device. In at least some embodiments, the photodetecting device is between the light-emitting device and the base substrate, and light emitted by the light-emitting device and that penetrates the light-sensitive layer reaches the light-trapping layer. In some embodiments, light-sensitive layer is between the light-emitting device and the light-trapping layer, so that light emitted by the light-emitting device can more easily reach the light-trapping layer after penetrating the light-sensitive layer. This can facilitate the return of the emitted light (for example, through reflection, refraction, scattering, and the like, by the light-trapping layer) to the light-sensitive layer, and promote the absorption of the emitted light by the light-sensitive layer.

The relative positions of the photodetecting device and the light-emitting device on the base substrate, in the horizontal direction parallel to the base substrate, are not particularly limited, so long as light emitted by the light-emitting device can enter the light-sensitive layer of the photodetecting device. In accordance with the direction of light emission, the light-emitting device may be top-emitting or bottom-emitting. The relative positions of the photodetecting device and the light-emitting device on the base substrate, in the horizontal direction parallel to the base substrate, may be determined based on the type of the light-emitting device.

In at least some embodiments, the light-emitting device may comprise a third electrode, a light-emitting layer, and a fourth electrode arranged in this order on the base substrate. The third electrode is closer to the base substrate than the light-emitting layer and the fourth electrode. For example, as shown in FIG. 6, the light-emitting device 210 comprises the third electrode 211, the light-emitting layer 212, and the fourth electrode 213 arranged in this order on the base substrate 100. The third electrode 211 is coupled to the drain electrode of the first switch 220. In at least some embodiments, the display substrate comprises a plurality of light-emitting devices 210. In such embodiments, the plurality of light-emitting devices 210 may be formed as a integrate structure with the fourth electrode 213. More particularly, the fourth electrode 213 may serve as the common electrode for the plurality of light-emitting devices 210.

In at least some embodiments, one of the third electrode and the fourth electrode is an anode, and the other of the third electrode and the fourth electrode is a cathode. For example, as shown in FIG. 6, the third electrode 211 may be configured as the anode of the light-emitting device, and the fourth electrode 213 may be configured as the cathode of the light-emitting device. The descriptions below are based on these configurations in FIG. 6.

In at least some embodiments, the light-emitting device is top-emitting. In such embodiments, the third electrode is the reflective electrode, and the fourth electrode is the transparent electrode. At least a portion of the orthographic projection of the light-sensitive layer on the base substrate is outside the orthographic projection of the third electrode on the base substrate. That is, the orthographic projection of the light-sensitive layer on the base substrate overlaps only partially with the orthographic projection of the third electrode on the base substrate. In some embodiments, the orthographic projection of the light-sensitive layer on the base substrate is entirely outside the orthographic projection of the third electrode on the base substrate. That is, the orthographic projection of the light-sensitive layer on the base substrate does not overlap with the orthographic projection of the third electrode on the base substrate.

For example, in the context of FIG. 6, the third electrode 211 is the reflective electrode, and the fourth electrode 213 is the transparent electrode. Light emitted from the light-emitting layer 212 exits through the fourth electrode 213. The light-sensitive layer 311 and the light-emitting device 210 (or the third electrode 211) do not overlap in a horizontal direction parallel to the substrate. As such, light emitted through the side of the light-emitting device 210 is able to enter the light-sensitive layer 311.

In embodiments where the third electrode is the reflective electrode and the anode, the third electrode may comprise a first sub-electrode layer having a high work function. The material for forming the first sub-electrode layer is electrically conductive, transparent, and has a high work function. Such a material includes, but is not limited to, an inorganic metal oxide (for example, indium tin oxide (ITO) and the like); a metal (gold, copper, silver, platinum, and the like); a conductive organic polymer (for instance, PEDOT:PSS (poly(3,4-ethylenedioxythiophene)-poly(styrene sulfonate)), PANI (polyaniline), and the like). In some embodiments, the first sub-electrode layer is composed of a transparent material, and the first sub-electrode layer may further comprise a reflective layer. The reflective layer may be composed of a metal, including, but not limited to, silver, aluminum, copper, or an alloy thereof. For example, in some embodiments, the first sub-electrode layer is composed of ITO, and the reflective layer is composed of silver. In some embodiments, the third electrode may comprise a stack comprising a single first sub-electrode layer composed of ITO and a single reflective layer composed of silver. In other embodiments, the third electrode may comprise a stack comprising two first sub-electrode layers composed of ITO and a single reflective layer composed of silver between the two first sub-electrode layers.

In embodiments where the fourth electrode is the transparent electrode and the cathode, the fourth electrode may be composed of a material that is electrically conductive and has a low work function. Such a material includes, but is not limited to, a metal having a low work function (for example, lithium, magnesium, calcium, barium, aluminum, indium, and the like), or an alloy formed by mixing the metal having a low work function with copper, gold, and/or silver. The thickness of the fourth electrode is configured to allow light to pass through.

FIG. 7 shows a schematic cross-sectional view of a display substrate according to another embodiment of the present disclosure.

In at least some embodiments, the light-emitting device is bottom-emitting. In such embodiments, the third electrode is the transparent electrode, and the fourth electrode is the reflective electrode. The orthographic projection of the light-sensitive layer on the base substrate is at least partially within the orthographic projection of the third electrode on the base substrate. That is, the orthographic projection of the light-sensitive layer on the base substrate overlaps at least partially with the orthographic projection of the third electrode on the base substrate.

For example, as shown in FIG. 7, the third electrode 211 is configured as the transparent electrode, and the fourth electrode 213 is configured as the reflective electrode. Light emitted by the light-emitting layer 212 exits through the third electrode 211. The light-sensitive layer 211 and the light-emitting device 210 (or the third electrode 211) overlaps in a horizontal direction parallel to the base substrate 100, so as to maximize the amount of emitted light that enters the light-sensitive layer 311, the absorption of light by the light-sensitive layer 311, and ultimately, the sensitivity of the photodetecting device 310.

In embodiments where the third electrode is the transparent electrode and the anode, the material for forming the third electrode is electrically conductive, transparent, and has a high work function. Such a material includes, but is not limited to, an inorganic metal oxide (for example, indium tin oxide (ITO) and the like); a metal (gold, copper, silver, platinum, and the like); a conductive organic polymer (for instance, PEDOT:PSS (poly(3,4-ethylenedioxythiophene)-poly(styrene sulfonate)), PANI (polyaniline), and the like).

In embodiments where the fourth electrode is the reflective electrode and the cathode, the fourth electrode may be composed of a material that is electrically conductive and has a low work function. Such a material includes, but is not limited to, a metal having a low work function (for example, lithium, magnesium, calcium, barium, aluminum, indium, and the like), or an alloy formed by mixing the metal having a low work function with copper, gold, and/or silver. The thickness of the fourth electrode is configured to allow light to pass through.

In at least some embodiments, the light-emitting device is an organic light-emitting diode (OLED) device. The light-emitting layer in such a light-emitting device may be configured in any appropriate manner known to a person of ordinary skill in the art. For example, the light-emitting layer may comprise an organic light-emitting layer, a hole injection layer, a hole transport layer, an electron transport layer, and an electron injection layer. The light-emitting layer may further comprise a hole blocking layer and an electron blocking layer. The hole blocking layer may be between the electron transport layer and the organic light-emitting layer. The electron blocking layer may be between the hole transport layer and the organic light-emitting layer. In some embodiments, the third electrode in the OLED is the anode, and the fourth electrode is the cathode. In such embodiments, the hole injection layer, the hole transport layer, the electron blocking layer, the organic light-emitting layer, the hole blocking layer, the electron transport layer, and the electron injection layer are arranged in this order in the direction of the third electrode to the fourth direction.

The color of the light emitted by the OLED is not particularly limited, and may be configured depending on need. For example, depending on the organic light-emitting materials used, the OLED may be configured to emit red light, green light, blue light, yellow light, white light, or light of any other color.

In at least some embodiments, the photodetector may further comprise a signal line coupled to the second electrode of the photodetecting device. For example, as shown in FIG. 6, the signal line 350 is coupled to the second electrode 314 of the photodetecting device 310. The signal line 350 may be configured to supply the second electrode 314 with a constant voltage. The voltage supplied by the signal line 350 may be set in accordance with the constant voltage VO in the embodiments illustrated in FIGS. 4A and 4b.

In at least some embodiments, the signal line 350 is formed in the same layer, and composed of the same material, as the third electrode 211 of the light-emitting device 210, for example, as shown in FIG. 6. This can simplify construction, streamline the fabrication of the display substrate, and reduce manufacturing costs.

In at least some embodiments, the display substrate may further comprise a flattening layer. In embodiments where the photodetecting device is between the light-emitting device and the base substrate, the flattening layer may be between the photodetecting device and the light-emitting device. For example, as shown in FIG. 6, the display substrate comprises the flattening layer 500 on the photodetecting device 310. After the photodetecting device 310 is formed on the bae substrate 100, forming the flattening layer on the photodetecting device 310 may increase the flatness and evenness of the display substrate surface, which may in turn improve the functions of the subsequently formed light-emitting device 210.

The flattening layer may be composed of any suitable material known to a person of ordinary skill in the art, including, but not limited to, polymethyl methacrylate, polyimide, epoxy resin, polyamide, acrylate, and the like.

In at least some embodiments, the display substrate may further comprise a pixel definition layer. The pixel definition layer comprises at least one opening. The opening in the pixel definition layer 600 functions to separate adjacent pixel units, and prevent interference. The light-emitting layer of the light-emitting device is formed in the opening of the boundary layer. The light-emitting layer in the opening of the boundary layer by printing. The entirety of the light-emitting layer may be formed in the opening, or only a portion of the light-emitting layer (for example, the hole injection layer, the hole transport layer, and the organic light-emitting layer) may be formed in the opening. For example, as shown in FIGS. 1B and 6, the pixel definition layer 600 comprises a single layer. The pixel definition layer 600 may be between the fourth electrode 213 and the signal line 350. The pixel definition layer 600 comprises at least one opening. As shown in FIGS. 1B and 6, the light-emitting layer 212 of the light-emitting device 210 is formed in the opening of the pixel definition layer 600.

The structure and configuration of the base substrate in the display substrate of the present disclosure are not particularly limited. In embodiments where the light-emitting device is bottom-emitting, the base substrate may be composed of a transparent material. The base substrate may be composed of a rigid material or a flexible material (for example, if the display substrate is to be used in a flexible display device). A suitable material for forming the base substrate includes, but is not limited to, glass, quartz, or a resinous material (for example, polyimide, polycarbonate, polyacrylate, polyetherimide, polyethersulfone, polyethylene terephthalate, polyethylene naphthalate, and the like, or a combination thereof).

The present disclosure also provides a display panel. The display panel may comprise a display substrate as described above. The display panel may further comprise a cover plate on the display substrate. The cover plate may be on the first protective layer (or the third protective layer). The display panel according to the present disclosure may be integrated into, for example, a mobile phone, a tablet, a television, a computer, a display, a notebook computer, a digital photo frame, a navigation system, and any other products or components that provide a display function. In addition, it is understood that the display panel according to the present disclosure may include any other suitable, additional components and/or accessories known to a person of ordinary skill in the art without departing from the spirit and scope of the present disclosure.

The present disclosure also provides a method of fabricating a display substrate. A base substrate is provided. A pixel unit is formed on the base substrate, the pixel unit comprising a light-emitting device. A photodetector is formed on the base substrate, the photodetector comprising a photodetecting device that comprises a light-trapping layer and a light-sensitive layer formed in this order on the base substrate. The photodetecting device is configured to receive light emitted by the light-emitting device, detect the emission intensity (or brightness) of the pixel unit, and convert the light signal corresponding to the detected intensity into an electrical signal. The photodetecting device is configured to transmit the electrical signal to a control circuit (for example, the controller described below). Based on the first electrical signal, the control circuit directs the drive circuit for driving the light-emitting device to provide a compensation for the drive voltage for the light-emitting device, so that the intensity of light emitted by the light-emitting device is at the desired level, and the grayscale of the pixel unit matches the desired grayscale. The photodetector according to the present disclosure is thus able to monitor in real-time the light intensity of a pixel unit, and adjust the light intensity of the pixel unit accordingly to the desired level. In turn, the display quality of the OLED display device can be improved, for example, in terms of grayscale, brightness, and evenness.

The method of fabricating a display substrate according to the present disclosure further comprises forming a light-trapping layer. The forming of the light-trapping layer comprises forming an amorphous material layer (for example, an amorphous silicon layer), and then forming the light-trapping layer by annealing the amorphous material layer, the light-trapping layer being polycrystalline (for example, polycrystalline silicon) and having a surface comprising a plurality of recessed portions and a plurality of raised portions. The annealing may be performed by laser annealing. More particularly, the annealing comprises performing laser annealing of the amorphous material layer through a micro lens array. During the crystallization of the amorphous material due to annealing, the raised and recessed portions are formed on the surface of the material, so as to produce the light-trapping layer of the display substrate of the present disclosure. The present disclosure remarkably simplifies the fabrication process, and lowers the manufacturing costs.

In at least some embodiments, the photodetecting device comprises a first electrode and a second electrode. In some embodiments, the forming of the photodetecting device comprises forming the first electrode on the base substrate, and then forming the light-trapping layer on the first electrode. In other embodiments, the forming of the photodetecting device comprises forming the light-trapping layer on the base substrate, and then forming the first electrode on the light-trapping layer, so that at least a surface of the first electrode in contact with the light-trapping layer is formed with a plurality of recessed portions and a plurality of raised portions that are complementary to the recessed and raised portions, respectively, on the surface of the light-trapping layer. The light-sensitive layer is formed on the stack comprising the light-trapping layer and the first electrode. The second electrode is formed on the light-sensitive layer. In the method of fabricating a display substrate according to the present disclosure, regardless of whether the light-trapping layer is formed on or below the first electrode, the light-trapping layer may be formed with the appropriate recessed and raised portions for lengthening the optical path of the light emitted by the light-emitting device in the light-sensitive layer. The present disclosure thus makes it possible to increase the absorption of the emitted light by the light-sensitive layer, which can in turn increase the sensitivity of the photodetecting device.

FIGS. 8A to 8L show schematic diagrams of a method of fabricating a display substrate according to an embodiment of the present disclosure. The descriptions below are based on embodiments of the display substrate of the present disclosure where the switches are top gate thin film transistors and the light-emitting device is top-emitting, for example, as shown in FIG. 1. However, it is understood that a person of ordinary skill in the art would know to make the appropriate modification(s) to fabricate other embodiments of the display substrate according to the present disclosure without departing from the spirit and scope of the present disclosure.

Figure 8A:
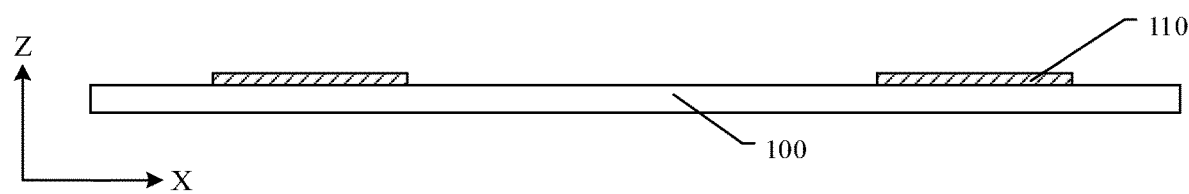
FIGS. 8A to 8L show schematic diagrams of a method of fabricating a display substrate according to an embodiment of the present disclosure.

As shown in FIG. 8A, the base substrate 100 is provided. A layer of light-shielding material is provided on the base substrate 100, and then patterned to form the light-shielding layer 110.

The light-shielding layer 110 is configured to shield light that may be transmitted through the base substrate 100, so as to prevent light from interfering with the subsequent formation of the active layers of the switches and reducing the electrical performance of the switches. The light-shielding material may be a metallic material (for example, molybdenum, copper, aluminum, and the like) or non-metallic amorphous material (for example, amorphous silicon).

The patterning process may utilize photolithography. The process may comprise applying a photoresist layer on the structural layer to be patterned, exposing the photoresist layer through a mask, developing the exposed photoresist layer to obtain a photoresist pattern, etching the structural layer based on the photoresist pattern, and then removing the resist pattern to obtain the patterned structural layer. It is understood that if the structural layer to be patterned comprises a photoresist layer, then it may not be necessary to apply an additional photoresist layer on the structural layer.

Figure 8B:
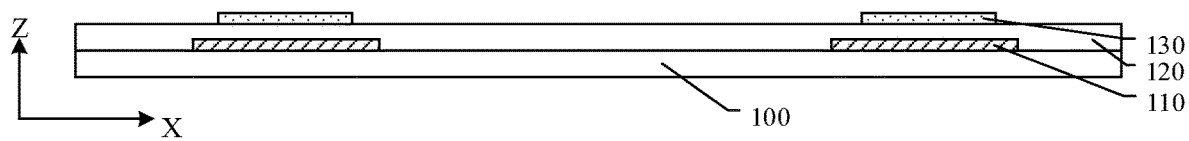

As shown in FIG. 8B, a layer of insulating layer is deposited on the base substrate 100 to form a buffer layer 120. A layer of semiconductor material is deposited on the buffer layer 120, and then patterned to form the active layer 130.

The buffer layer 120 functions as a transition layer between the base substrate 100 (or the light-shielding layer 110) and the active layer (130), and stabilizes the bonding between the active layer 130 and the base substrate 100. The buffer layer 120 also functions to keep out contaminants (for example, impurities or ions) from the active layer 130. The buffer layer 120 may be composed of silicon oxide ($SiO_x$), silicon nitride ($SiN_x$), silicon oxynitride ($SiO_xN_y$), and the like. The buffer layer 120 may comprise a single layer or a plurality of layers. In embodiments where the buffer layer 120 comprises a plurality of layers, the layers may have the same composition or different compositions (for example, the buffer layer 120 may comprise a $SiO_x$ layer and a $SiN_x$ layer).

The active material 130 may be composed of any appropriate material known to a person of ordinary skill in the art. For example, the active layer 130 may be composed of amorphous silicon, polycrystalline silicon, indium gallium zinc oxide (IGZO), indium zinc oxide (IZO), zinc oxide (ZnO), gallium zinc oxide (GZO), and the like; or metal oxide and the like.

Figure 8C:
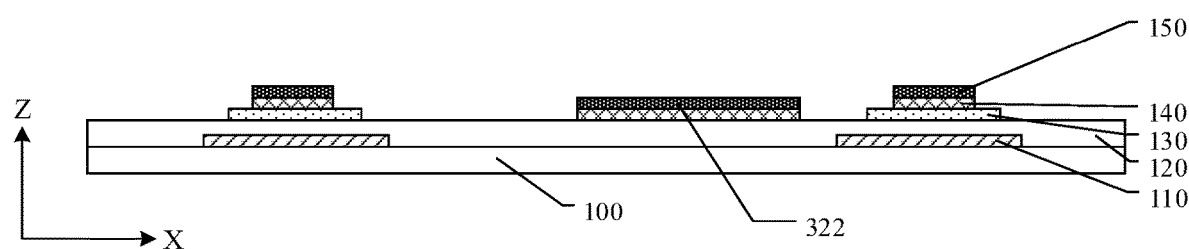

As shown in FIG. 8C, a layer of insulating material and a layer of electrically conductive material are deposited sequentially on the base substrate 100 comprising the active layer 130. The layer of insulating material and layer of electrically conductive material are then patterned to form the gate insulation layer 140 and gate electrode 150, respectively. For example, the layer of electrically conductive material may be patterned to form the gate electrode 150, and then with the gate electrode 150 acting as a mask, the layer of insulting material is patterned to form the gate insulation layer 140. In some embodiments, the layer of electrically conductive layer may be patterned to simultaneously form the gate electrode 150 and the sixth electrode 322.

The insulating material for forming the gate insulation layer 140 includes, but is not limited to, silicon nitride ($SiN_x$), silicon oxide ($SiO_x$), aluminum oxide ($Al_2O_3$), aluminum nitride (AlN), or any other suitable material known to a person of ordinary skill in the art.

The electrically conductive material for forming the gate electrode 150 includes, but is not limited to, copper (Cu), a copper/molybdenum alloy (Cu/Mo), a copper/titanium alloy (Cu/Ti), a copper/molybdenum/titanium alloy (Cu/Mo/Ti), a copper/molybdenum/tungsten alloy (Cu/Mo/W), a copper/molybdenum/niobium alloy (Cu/Mo/Nb), and the like. The gate electrode 150 may also be composed of a chromium-based material, including, but not limited to, a chromium/molybdenum alloy (Cr/Mo), a chromium/titanium alloy (Cr/Ti), a chromium/molybdenum/titanium alloy (Cr/Mo/Ti), and the like. The gate electrode 150 may also be composed of an aluminum-based material, including aluminum and aluminum-based alloy.

Figure 8D:
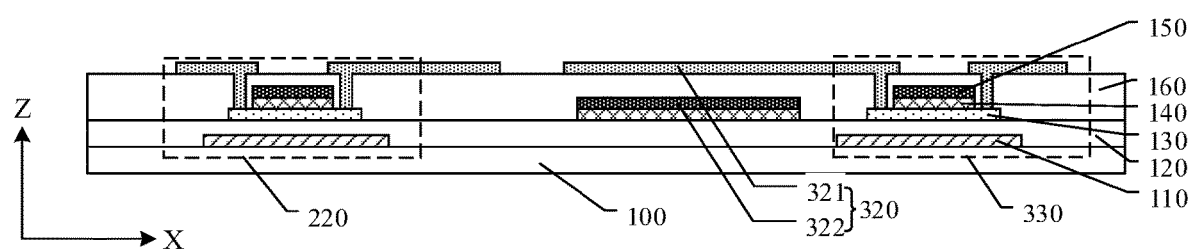

As shown in FIG. 8D, a layer of insulating material is deposited on the base substrate 100 to form the dielectric layer 160. Through-holes are formed in the dielectric layer 160 to expose the active layer 130. A layer of electrically conductive material is deposited on the dielectric layer 160, and then patterned to form the source electrode and drain electrode. The source electrode and drain electrode are electrically coupled to the active layer 130 through the through-holes in the dielectric layer 160. One of the source electrode and drain electrode is formed with an extension that overlaps with the sixth electrode 322, and the fifth electrode 321 is formed in the overlapped portion between the source electrode or drain electrode and the sixth electrode 322. The fifth electrode 321 and the sixth electrode 322 are separated by the dielectric layer 160. The fifth electrode 321, the sixth electrode 322, and the dielectric layer 160 between the fifth electrode 321 and the sixth electrode 322 form the first capacitor 320.

The insulating material for forming the dielectric layer 160 includes, but is not limited to, silicon oxide, silicon nitride, silicon oxynitride, and the like.

The electrically conductive material for forming the source and drain electrodes includes, but is not limited to, a metallic material (for example, aluminum, molybdenum, and the like). Each of the source electrode and the drain electrode may comprise a single layer (for example, a single aluminum layer or a single molybdenum layer) or a plurality of layers (for example, a three-layered structure comprising a layer of aluminum between two layers of molybdenum).

Figure 8E:
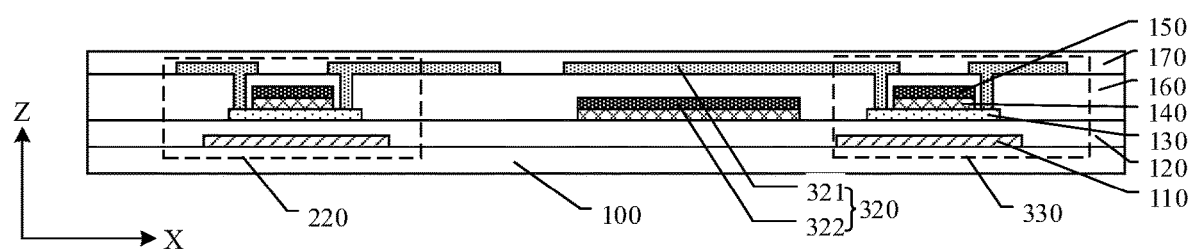

As shown in FIG. 8E, a layer of insulating material is deposited on the base substrate 100 to form a passivation layer 170. The insulating material for forming the passivation layer 170 includes, but is not limited to, silicon oxide, silicon nitride, and a resinous material such as acrylic resin.

Figure 8F:
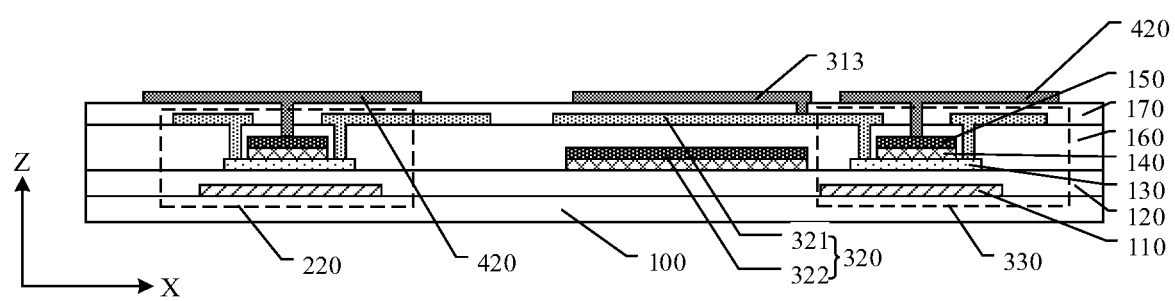

As shown in FIG. 8F, the passivation layer 170 and the dielectric layer 160 are patterned to form through-holes. A layer of electrically conductive material is deposited on the base substrate 100, and then patterned to form the first electrode 313 and the second barrier layer 420. The first electrode 313 is coupled to the fifth electrode 321 (or the source electrode or drain electrode of the switch) via the through-holes in the passivation layer 170. The second barrier layer 420 is coupled to the gate electrode 150 via the through-holes in the passivation layer 170 and the dielectric layer 160. The materials for forming the first electrode 313 and the second barrier layer 420 are as described above.

Figure 8G:
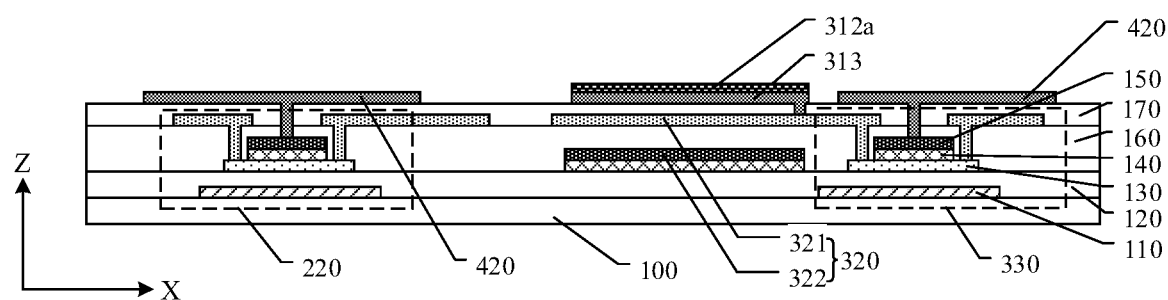

As shown in FIG. 8G, a layer of amorphous silicon is deposited on the base substrate 100, and then patterned to form the amorphous silicon layer on the first electrode 313.

Figure 8H:
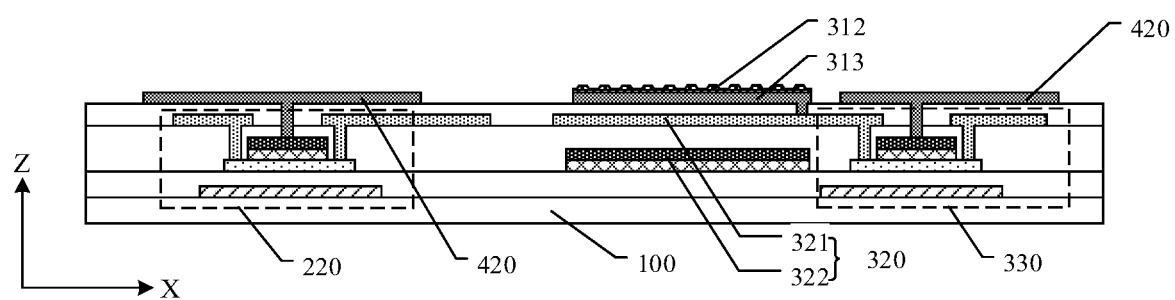

As shown in FIG. 8H, the amorphous silicon layer is subject to laser annealing through a micro lens array, which causes crystallization of the amorphous silicon layer to produce a polycrystalline silicon layer and which forms a plurality of recessed portions and raised portions on the surface of the resulting polycrystalline silicon layer. The polycrystalline silicon layer exhibits light-trapping effects, and functions as the light-trapping layer 312 in the display substrate of the present disclosure.

During laser annealing, the micro lens array (MLA) directs the incident laser beams to positions in the pixel region corresponding to the amorphous silicon layer. The laser annealing is therefore selective, precise, and localized, in that the incident laser does not illuminate other portions of the pixel region or the active layer in the switch. The present disclosure not only makes it possible to form an ordered pattern of recessed and raised portions on the polycrystalline silicon layer, but the present disclosure also protects the electrical performance of the switch, for example, from adverse effects caused by stray laser during fabrication.

During the laser annealing process, metal induced crystallization (MIC) may be utilized to facilitate the formation of the polycrystalline silicon layer.

In at least some embodiments, after the layer of amorphous silicon is deposited on the base substrate, the amorphous silicon layer may be subject to selective and localized laser annealing, so that only portions of the amorphous silicon layer to be formed into the light-trapping layer are laser annealed. The resulting polycrystalline silicon layer may then be patterned to remove amorphous silicon that has not undergone crystallization to obtain the light-trapping layer of the display substrate of the present disclosure.

Figure 8I:
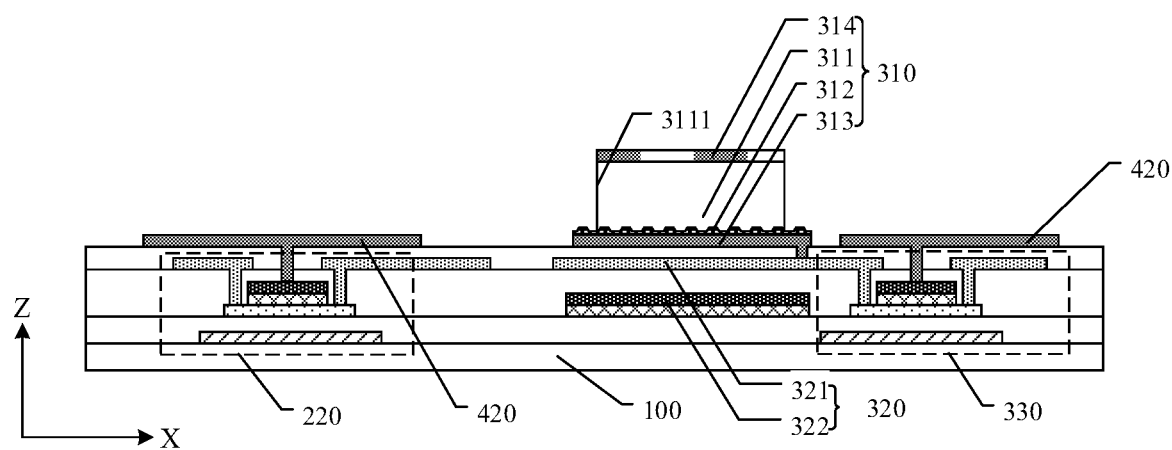

As shown in FIG. 8I, a layer of semiconductor material and a layer of electrically conductive layer are deposited on the base substrate 100. The layer of electrically conductive layer is patterned to form the second electrode 314. With the second electrode 314 acting as the mask, the layer of semiconductor material is patterned to form the light-sensitive layer 311. The structure and configuration of the second electrode 314 and the light-sensitive layer 311 are as described above.

Figure 8J:
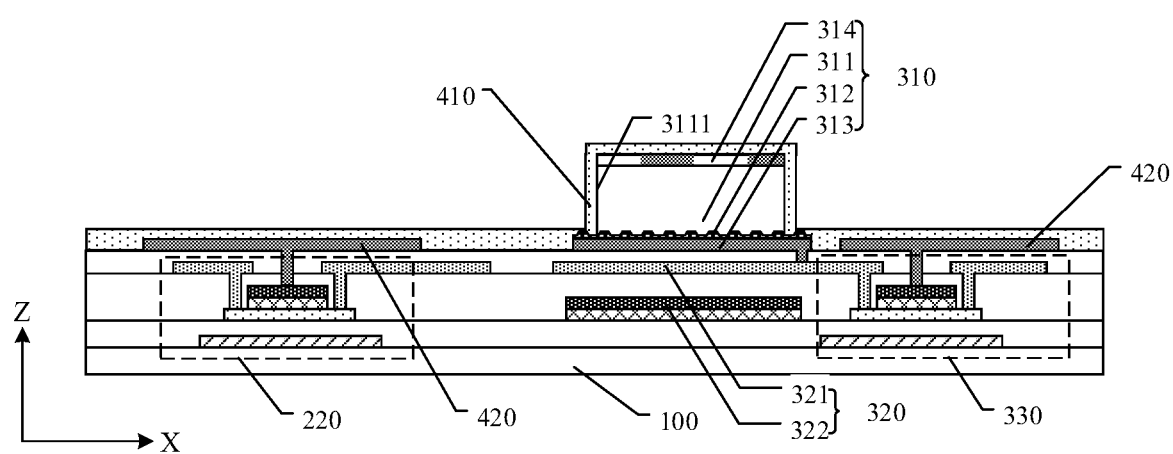

As shown in FIG. 8J, a layer of insulating material is deposited on the base substrate 100 to form the first barrier layer 410. The structure and configuration of the first barrier layer 410 is as descried above.

Figure 8K:
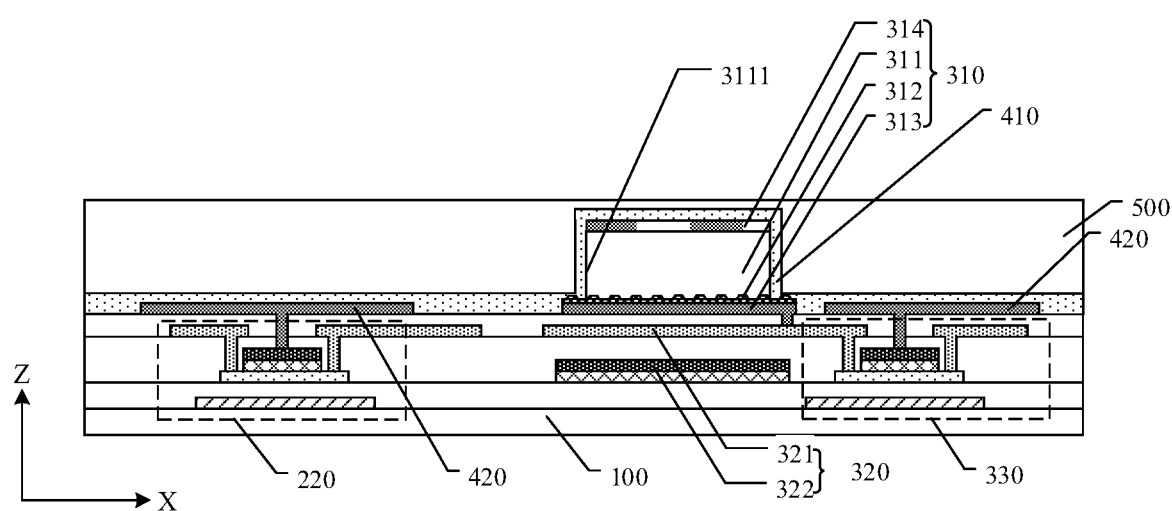

As shown in FIG. 8K, a layer of insulating material is deposited on the base substrate 100 to form the flattening layer 500. The flattening layer 500 functions to flatten the surface of the display substrate. The structure and configuration of the flattening layer 500 may be as described above.

Figure 8L:
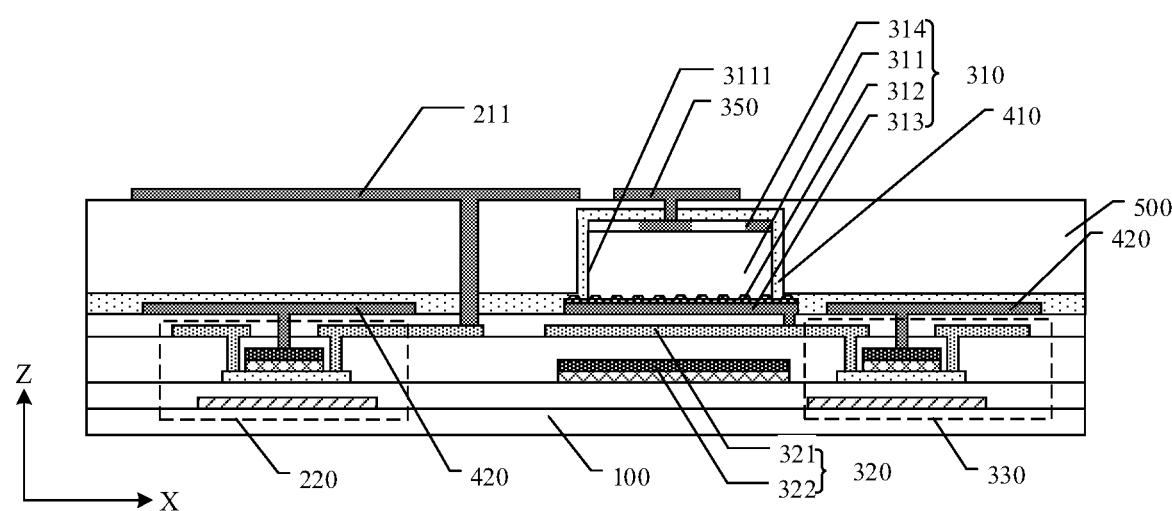

As shown in FIG. 8L, through-holes are formed in the flattening layer 500, the first barrier layer 410, and the passivation layer 170. A layer of electrically conductive material is deposited on the base substrate 100, and then patterned to form the third electrode 211 and the signal line 350. The third electrode 211 and the signal line 350 are spaced apart from each other. The third electrode 211 is coupled to the drain electrode of the switch (the first switch 220) via the through-holes in the flattening layer 500, the first barrier layer 410, and the passivation layer 170. The signal line 150 is coupled to the second electrode 314 via the through-holes in the flattening layer 500 and the first barrier layer 410. The structure and configuration of the third electrode 211 and signal line 350 are as described above.

As shown in FIG. 8L, as well as in FIG. 1B, a pixel definition layer 600 is formed on the base substrate 100. At least one opening is formed in the pixel definition layer 600 at a position corresponding to the third electrode 211. The light-emitting layer 212 is formed in the opening. A layer of electrically conductive layer is deposited on the base substrate 100 to form the fourth electrode 213. The third electrode 211, the light-emitting layer 212, and the fourth electrode 213 form the light-emitting device 210. The structure and configuration of the light-emitting device 210 are as described above.

Figure 9A:
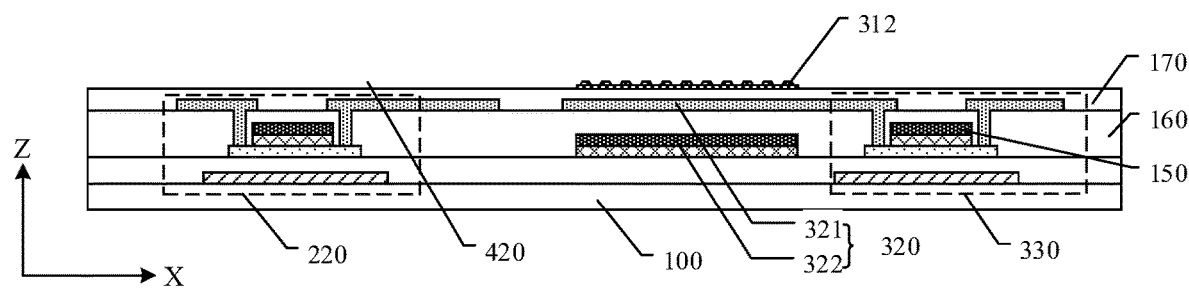
FIGS. 9A and 9B show schematic diagrams of a method of fabricating a display substrate according to another embodiment of the present disclosure.
Figure 9B:
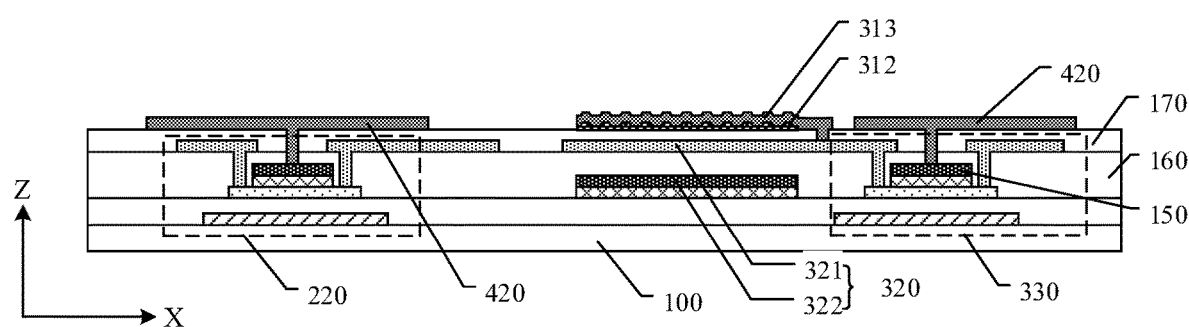

FIGS. 9A and 9B show schematic diagrams of a method of fabricating a display substrate according to another embodiment of the present disclosure.

The descriptions below are based on embodiments of the display substrate of the present disclosure where the switches are top gate thin film transistors and the light-emitting device is top-emitting, for example, as shown in FIG. 6. However, it is understood that a person of ordinary skill in the art would know to make the appropriate modification(s) to fabricate other embodiments of the display substrate according to the present disclosure without departing from the spirit and scope of the present disclosure.

A base substrate is provided, and a top-gate thin film transistor is formed on the base substrate, for example, in the manner shown in FIGS. 8A to 8E. As shown in FIG. 9A, on a display substrate as shown in FIG. 8E, a layer of amorphous silicon is deposited, and then patterned to form an amorphous silicon layer. The amorphous silicon layer is then subject to laser annealing to obtain a polycrystalline silicon layer. The polycrystalline silicon layer forms the light-trapping layer 312 in the display substrate according to the present disclosure. The light-trapping layer 312 is formed in the manner shown in FIGS. 8G to 8H.

As shown in FIG. 9B, through-holes are formed in the passivation layer 170 and dielectric layer 160 through patterning. A layer of electrically conductive material is deposited on the light-trapping layer 312, and then patterned to form the first electrode 313 and the second barrier layer 420. The first electrode 313 is coupled to the fifth electrode 321 (or the drain electrode or source electrode of the switch) via the through-hole in the passivation layer 170. The second barrier layer 420 is coupled to the gate electrode 150 via the through-holes in the passivation layer 170 and the dielectric layer 160. The structure and configuration of the first electrode 313 and the second barrier layer 420 are as described above.

As shown in FIG. 9B, as well as FIG. 6, after the first electrode 313 is formed, the light-sensitive layer 311, the second electrode 314, the first barrier layer 410, the flattening layer 500, the third electrode 211, the signal line 350, the pixel definition layer 600, the light-emitting layer 212, and the fourth electrode 213 are formed in this order on the base substrate. These structural layers are formed in the manner shown in FIGS. 8I to 8L and as described above.

In the description of the specification, references made to the term "some embodiment," "some embodiments," and "exemplary embodiments," "example," and "specific example," or "some examples" and the like are intended to refer that specific features and structures, materials or characteristics described in connection with the embodiment or example that are included in at least some embodiments or example of the present disclosure. The schematic expression of the terms does not necessarily refer to the same embodiment or example. Moreover, the specific features, structures, materials or characteristics described may be included in any suitable manner in any one or more embodiments or examples. In addition, for a person of ordinary skill in the art, the disclosure relates to the scope of the present disclosure, and the technical scheme is not limited to the specific combination of the technical features, and also should covered other technical schemes which are formed by combining the technical features or the equivalent features of the technical features without departing from the inventive concept. What is more, the terms "first" and "second" are for illustration purposes only and are not to be construed as indicating or implying relative importance or implied reference to the quantity of indicated technical features. Thus, features defined by the terms "first" and "second" may explicitly or implicitly include one or more of the features. In the description of the present disclosure, the meaning of "plural" is two or more unless otherwise specifically and specifically defined.

The principle and the embodiment of the present disclosures are set forth in the specification. The description of the embodiments of the present disclosure is only used to help understand the method of the present disclosure and the core idea thereof. Meanwhile, for a person of ordinary skill in the art, the disclosure relates to the scope of the disclosure, and the technical scheme is not limited to the specific combination of the technical features, and also should covered other technical schemes which are formed by combining the technical features or the equivalent features of the technical features without departing from the inventive concept. For example, technical scheme may be obtained by replacing the features described above as disclosed in this disclosure (but not limited to) with similar features.

What is claimed is:

1. A display substrate, comprising
a base substrate, a photodetector on the base substrate, and a pixel unit on the base substrate, wherein
the pixel unit includes a light-emitting device configured to emit light, and the photodetector includes a first electrode, a second electrode, a light-sensitive layer, and a light-trapping layer;
the light-sensitive layer is between the first electrode and the second electrode, and the light-trapping layer is between the light-sensitive layer and the base substrate;
the display substrate further includes a first barrier layer, the first barrier layer covers a top surface of the light-sensitive layer and a portion of a side surface of the light-sensitive layer, and the first barrier layer is configured to prevent ions in other layers of the display substrate from contaminating the light-sensitive layer.

2. The display substrate according to claim 1,
wherein the pixel unit further comprises a first switch between the base substrate and the light-emitting device, and the photodetector further comprises a second switch between the base substrate and the first electrode, and
wherein the first electrode is coupled to the second switch.

3. The display substrate according to claim 2,
wherein the light-emitting device comprises a third electrode, a light-emitting layer, and a fourth electrode arranged in a stack, the fourth electrode being farther from the base substrate than the third electrode and the light-emitting layer, and
wherein the third electrode is coupled to the first switch.

4. The display substrate according to claim 3,
wherein the third electrode is a reflective electrode, and the fourth electrode is a transparent electrode, and
wherein an orthographic projection of the light-sensitive layer on the base substrate is entirely outside an orthographic projection of the third electrode on the base substrate.

5. The display substrate according to claim 4,
wherein the third electrode comprises at least one sub-electrode layer composed of a transparent conductive material, and a reflective layer composed of a metallic material selected from the group consisting of silver, aluminum, copper, and an alloy thereof.

6. The display substrate according to claim 3,
wherein the third electrode is a transparent electrode, and the fourth electrode is a reflective electrode, and
wherein an orthographic projection of the light-sensitive layer on the base substrate at least partially overlaps with an orthographic projection of the third electrode on the base substrate.

7. The display substrate according to claim 6, wherein the fourth electrode is composed of a metallic material selected from the group consisting of lithium, magnesium, calcium, barium, aluminum, indium, and an alloy thereof.

8. A display panel comprising the display substrate according to claim 1.

9. The display substrate according to claim 1, wherein the display substrate further includes a first capacitor, the first electrode is one electrode of the first capacitor.

10. The display substrate according to claim 2, wherein the display substrate further includes a second barrier layer, the first switch and the second switch are transistors, the first switch includes a first gate electrode, the second switch includes a second gate electrode, and the second barrier layer includes the first gate electrode and the second gate electrode;
the first switch and the second switch are disposed between the second barrier layer and the base substrate;
an orthographic projection of the first gate electrode on the base substrate covers an orthographic projection of the first switch on the base substrate; and an orthographic projection of the second gate electrode on the base substrate covers an orthographic projection of the second switch on the base substrate.

\* \* \* \* \*